United States Patent
Park et al.

(10) Patent No.: US 12,532,673 B2
(45) Date of Patent: Jan. 20, 2026

(54) METHOD OF FORMING PN JUNCTION INCLUDING TRANSITION METAL DICHALCOGENIDE, METHOD OF FABRICATING SEMICONDUCTOR DEVICE USING THE SAME, AND SEMICONDUCTOR DEVICE FABRICATED BY THE SAME

(71) Applicant: SAMSUNG ELECTRONICS CO., LTD., Suwon-si (KR)

(72) Inventors: Sang-Yong Park, Suwon-si (KR); Jin-Hyuk Kim, Suwon-si (KR); Jin-Hong Park, Suwon-si (KR); Sejin Kyung, Suwon-si (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 436 days.

(21) Appl. No.: 18/093,653

(22) Filed: Jan. 5, 2023

(65) Prior Publication Data

US 2023/0245887 A1    Aug. 3, 2023

(30) Foreign Application Priority Data

Jan. 28, 2022    (KR) .................. 10-2022-0013271
Apr. 20, 2022    (KR) .................. 10-2022-0048614

(51) Int. Cl.
*H01L 21/02* (2006.01)
*H10D 30/43* (2025.01)
(Continued)

(52) U.S. Cl.
CPC .. *H01L 21/02614* (2013.01); *H01L 21/02381* (2013.01); *H01L 21/02488* (2013.01);
(Continued)

(58) Field of Classification Search
CPC ......... H01L 21/02568; H01L 21/02664; H01L 21/02104; H01L 21/04; H01L 21/02417;
(Continued)

(56) References Cited

U.S. PATENT DOCUMENTS

| | | |
|---|---|---|
| 9,595,580 B2 | 3/2017 | Shin et al. |
| 2021/0183650 A1* | 6/2021 | Chiu .................. C23C 16/40 |

(Continued)

FOREIGN PATENT DOCUMENTS

| | | |
|---|---|---|
| CN | 113871453 A | 12/2021 |
| KR | 10-2009-0029488 A | 3/2009 |

(Continued)

OTHER PUBLICATIONS

Li, Synthesis of Ultrathin Composition Graded Doped Lateral WSe2/WS2 Heterostructures, 2017, ACS Appl. Mater. Interfaces, 9, 39, 34204-34212. (Year: 2017).*

(Continued)

*Primary Examiner* — Ajay Ojha
*Assistant Examiner* — Sandra Milena Rodriguez Villanu
(74) *Attorney, Agent, or Firm* — Sughrue Mion, PLLC

(57) ABSTRACT

Disclosed are methods of forming PN junction structures, methods of fabricating semiconductor devices using the same, and semiconductor devices fabricated by the same. The method of forming a PN junction structure includes: forming on a substrate a first material layer that includes first transition metal atoms and first chalcogen atoms, loading the first material layer into a process chamber and supplying a gas of second chalcogen atoms, and forming a second material layer by substituting the second chalcogen atoms for the first chalcogen atoms on a selected portion of the first material layer. The first material layer has one of n-type (Continued)

conductivity and p-type conductivity. The second material layer has the other of the n-type conductivity and the p-type conductivity.

17 Claims, 20 Drawing Sheets

(51) Int. Cl.
*H10D 62/80* (2025.01)
*H10D 99/00* (2025.01)
*H10F 39/00* (2025.01)
H10D 30/67 (2025.01)
H10D 62/10 (2025.01)

(52) U.S. Cl.
CPC ....... *H01L 21/02568* (2013.01); *H10D 30/43* (2025.01); *H10D 62/80* (2025.01); *H10D 99/00* (2025.01); *H10F 39/8033* (2025.01); *H10F 39/80377* (2025.01); *H10D 30/6735* (2025.01); *H10D 62/121* (2025.01)

(58) Field of Classification Search
CPC .. H10D 62/80; H10D 30/6757; H10D 30/014; H10D 30/47; H10D 62/85; H10D 62/364; H10D 62/151; B82Y 10/00
See application file for complete search history.

(56) References Cited

U.S. PATENT DOCUMENTS

| | | | |
|---|---|---|---|
| 2021/0226046 | A1 | 7/2021 | Li |
| 2021/0366708 | A1 | 11/2021 | Kim et al. |
| 2022/0115541 | A1* | 4/2022 | Li ..................... H10D 30/6729 |
| 2022/0178018 | A1* | 6/2022 | Wong ................... C23C 16/305 |
| 2023/0197860 | A1* | 6/2023 | Naylor ................ H10D 62/235 257/51 |

FOREIGN PATENT DOCUMENTS

| | | |
|---|---|---|
| KR | 10-2012-0135628 A | 12/2012 |
| KR | 10-1933109 B1 | 12/2018 |
| KR | 10-1942625 B1 | 4/2019 |
| KR | 10-2019-0060638 A | 6/2019 |
| KR | 10-2019-0074627 A | 6/2019 |
| KR | 10-2144999 B1 | 8/2020 |
| KR | 10-2021-0065011 A | 6/2021 |

OTHER PUBLICATIONS

Samani, Patterned arrays of lateral heterojunctions within monolayer two-dimensional semiconductors, 2015, Nature communications 6, Article No. 7749. (Year: 2015).*
Jin-Hyuk Kim et al., "Controllable Synthesis of Lateral WS2/ WSe2 Hetero-structure via Partial Selenium substitution", 2021, International Conference on Electronics, Information, and Communication (ICEIC), 3 Pages Total.

* cited by examiner

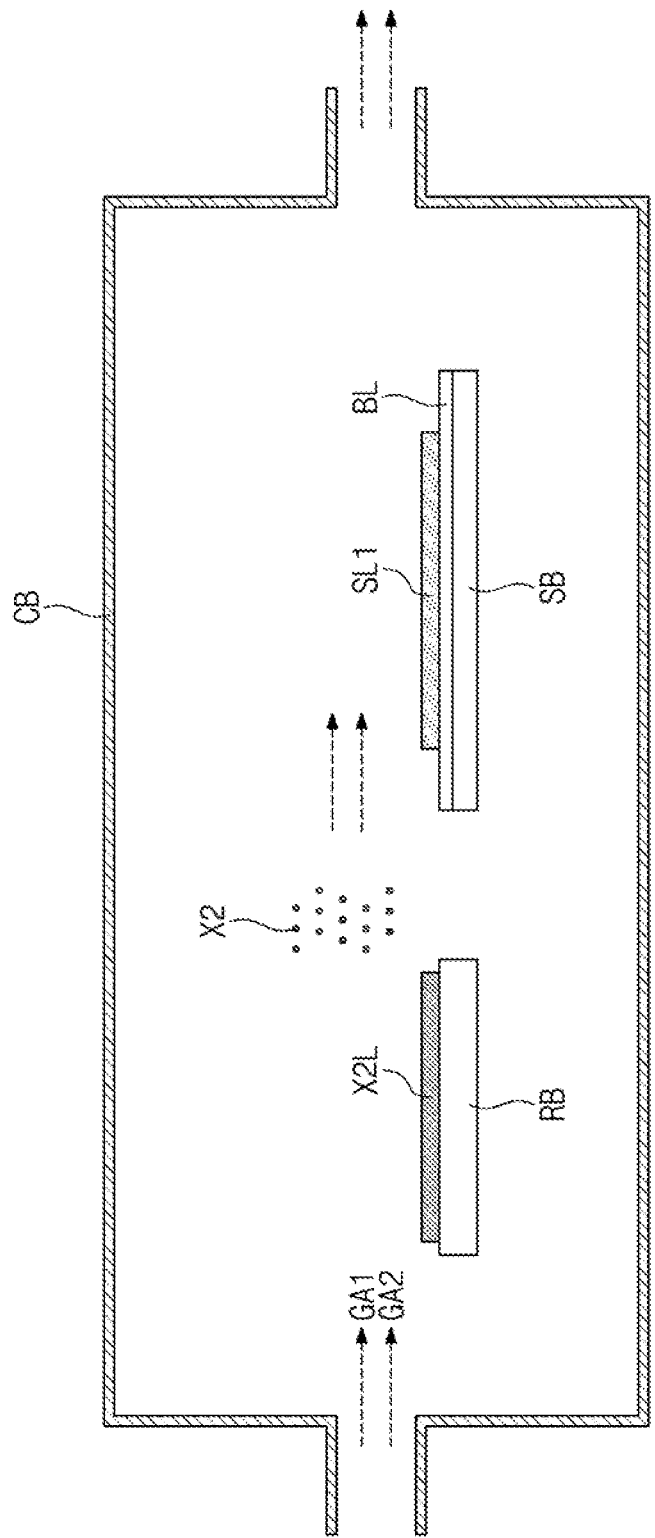

METHOD OF FORMING PN JUNCTION INCLUDING TRANSITION METAL DICHALCOGENIDE, METHOD OF FABRICATING SEMICONDUCTOR DEVICE USING THE SAME, AND SEMICONDUCTOR DEVICE FABRICATED BY THE SAME

CROSS-REFERENCE TO RELATED APPLICATIONS

This application claims priority from Korean Patent Application No. 10-2022-0013271 filed on Jan. 28, 2022 and Korean Patent Application No. 10-2022-0048614 filed on Apr. 20, 2022 in the Korean Intellectual Property Office, the disclosures of which are incorporated herein in their entireties by reference.

BACKGROUND

The disclosure relates to a method of forming a PN junction that includes transition metal dichalcogenide (TMD), a method of fabricating a semiconductor device including the same, and a semiconductor device fabricated by the same.

A two-dimensional material is a single-layered or half-layered solid in which atoms constitute a crystal structure. Graphene and TMD are representative two-dimensional materials.

The TMD, which is a compound of transition metal and chalcogen, is a nano-material of which a structure is similar to that of graphene. Due to an extremely small thickness as that of an atomic layer, the TMD is flexible and transparent, and has electrical characteristics similar to semiconductors and conductors. These two-dimensional materials are in the spotlight as next-generation semiconductor materials capable of overcoming limitations of existing semiconductor devices. For these reasons, studies have been conducted to fabricate semiconductor devices including two-dimensional materials such as TMD.

SUMMARY

Some embodiments provide a method of forming a PN junction including TMD, which method may increase mass production.

Some embodiments provide a method of fabricating a semiconductor device, which method may improve electrical properties of the semiconductor device.

Some embodiments provide a semiconductor device having increased reliability.

The object of the disclosure is not limited to the mentioned above, and other objects which have not been mentioned above will be clearly understood to those skilled in the art from the following description.

According to embodiments, a method of forming a PN junction structure may include: forming on a substrate a first material layer that includes first transition metal atoms and first chalcogen atoms, the first material layer having one of n-type conductivity and p-type conductivity; loading the first material layer into a process chamber and supplying a gas of second chalcogen atoms; and forming a second material layer by substituting the second chalcogen atoms for the first chalcogen atoms on a selected portion of the first material layer, the second material layer having the other of the n-type conductivity and the p-type conductivity.

According to embodiments, a method of fabricating a semiconductor device may include: forming on a substrate a first material layer that includes first transition metal atoms and first chalcogen atoms, the first material layer being a first conductivity type; loading the first material layer into a process chamber and supplying a gas of second chalcogen atoms; forming a second material layer by substituting the second chalcogen atoms for the first chalcogen atoms on a selected portion of the first material layer, the second material layer being a second conductivity type opposite to the first conductivity type; and forming a gate electrode on the first material layer.

According to embodiments, a semiconductor device may comprise: a substrate; a first impurity region on the substrate; and a gate electrode on the substrate adjacent to the first impurity region. The substrate may include a first transition metal and first chalcogen elements. In the substrate, the first chalcogen elements may not satisfy a stoichiometric ratio.

BRIEF DESCRIPTION OF DRAWINGS

FIG. 2 illustrates a process chamber in which a PN junction is formed according to an embodiment.

DETAILED DESCRIPTION

Some embodiments of the disclosure will now be described in detail with reference to the accompanying drawings. The embodiments described herein are example embodiments that do not limit the disclosure thereto.

It will be also understood that, even if a certain step or operation of manufacturing an apparatus or structure is described later than another step or operation, the step or operation may be performed later than the other step or operation unless the other step or operation is described as being performed after the step or operation. Further, functions, operations or steps described in a particular block may occur in a different way from a flow described in the flowchart. For example, two consecutive blocks may be performed simultaneously, or the blocks may be performed in reverse according to related functions, operations or steps.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that, although the terms first, second, third, fourth, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
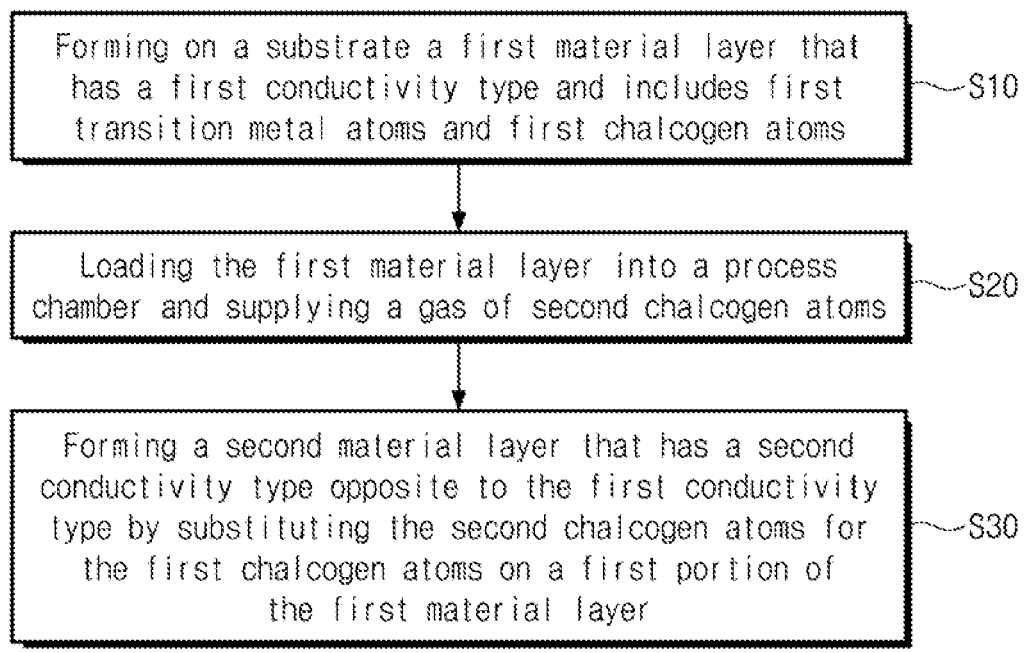
FIG. 1 illustrates a flow chart showing a method of forming a PN junction, according to embodiments.
Figure 3A:
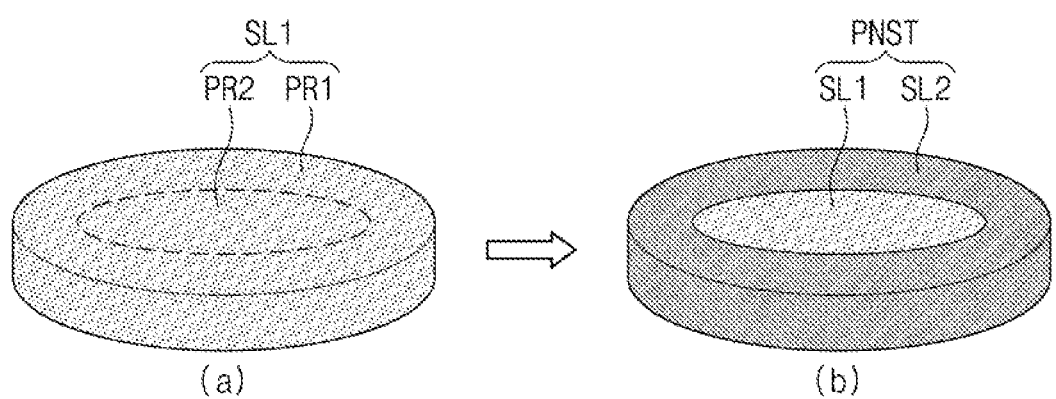
FIG. 3A illustrates a simplified state change in forming a PN junction according to an embodiment.
Figure 3B:
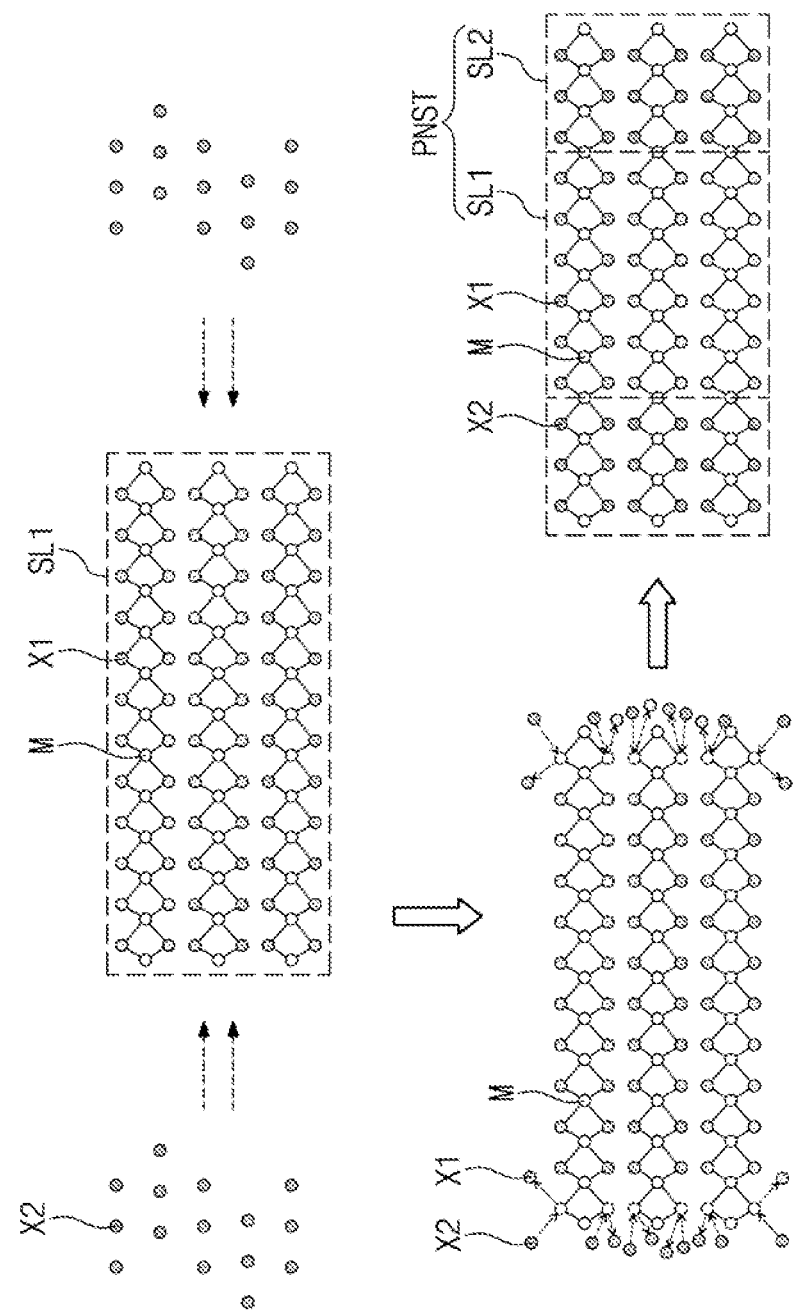
FIG. 3B illustrates simplified atomic arrangement change in forming a PN junction according to an embodiment.

FIG. 1 illustrates a flow chart showing a method of forming a PN junction, according to embodiments. FIG. 2 illustrates a process chamber in which a PN junction is formed according to an embodiment. FIG. 3A illustrates a simplified state change in forming a PN junction according to an embodiment. FIG. 3B illustrates simplified atomic arrangement change in forming a PN junction according to an embodiment.

Referring to FIGS. 1, 2, 3A and 3B, a substrate SB may be provided thereon with a first material layer SL1 that is a first conductivity type, and includes first transition metal atoms M and first chalcogen atoms (or elements) X1 (S10 in FIG. 1), according to embodiments. The first material layer SL1 may be called a first two-dimensional material layer, a first two-dimensional semiconductor material layer, a first semiconductor layer, or a first transition metal dichalcogenide (TMD) layer. The substrate SB may include at least one selected from Si, $SiO_2$, $Al_2O_3$, MgO, SiC, $Si_3N_4$, glass, quartz, sapphire, graphite, graphene, polyimide copolymer, polyimide, polyethylene naphthalate (PEN), fluoropolymer (FEP) and polyethylene terephthalate (PET), not being limited thereto. The substrate SB may be, for example, a silicon wafer. A buffer layer BL may be formed on the substrate SB. The buffer layer BL may include, for example, silicon oxide. The buffer layer BL may be in contact with the first material layer SL1.

The first material layer SL1 may be formed by chemical vapor deposition (CVD) or atomic layer deposition (ALD). Alternatively, the first material layer SL1 may be formed by preparing powder of a first material included in the first material layer SL1, and using a tape to obtain flakes of the first material from the powder of the first material.

The first conductivity type may be, for example, an n-type. The first transition metal atoms M may be one of tungsten (W), and molybdenum (Mo), not being limited thereto. The first chalcogen atoms X1 may be sulfur (S), not being limited thereto. The first material layer SL1 may include the first chalcogen atoms X1 of which an amount does not satisfy a stoichiometric ratio. The first material layer SL1 may be one of $MoS_a$ and $WS_b$, not being limited thereto, where subscripts a and b may independently be a positive real number equal to or less than 2, according to an embodiment. When the subscripts a and b are less than 2, the first material layer SL1 may have an increased amount of electrons to exhibit stronger n-type conductivity.

In (a) state of FIG. 3A, the first material layer SL1 may include a first portion PR1 and a second portion PR2. The second portion PR2 may correspond to a central portion of the first material layer SL1, according to an embodiment. The first portion PR1 may correspond to an edge or circumference of the first material layer SL1, according to an embodiment.

Referring to FIGS. 1 and 2, the first material layer SL1 may be loaded into a process chamber CB and a gas of second chalcogen elements (or atoms) X2 may be provided (S20 in FIG. 1). For example, the process chamber CB may receive the substrate SB on which the first material layer SL1 is formed. The process chamber CB may be a furnace or a single type apparatus. The process chamber CB may be a CVD chamber or an ALD chamber.

A process for supplying the gas of the second chalcogen atoms X2 may include an operation of positioning a source layer X2L including the second chalcogen atoms X2 so as to be spaced apart from the substrate SB, an operation of heating the source layer X2L to evaporate the second chalcogen atoms X2, and an operation of supplying the process chamber CB with a carrier gas GA1 to allow the evaporated second chalcogen atoms X2 to move toward a position around the first material layer SL1. The source layer X2L may be positioned on a carrier substrate RB. The carrier substrate RB may be formed of, for example, glass. The heating of the source layer X2L may be achieved by heating the process chamber CB, heating atmosphere (or carrier gas) in the process chamber CB, or raising a temperature of a chuck on which the source layer X2L is placed. The carrier gas GA1 may be, for example, at least one of nitrogen and argon not being limited thereto. The carrier gas GA1 may be supplied at a flow rate of about 100 sccm to about 1,100 sccm.

The source layer X2L may be heated at a temperature of about 300° C. to about 1,000° C., and thus, the second chalcogen atoms X2 included in the source layer X2L may be evaporated. When the carrier gas GA1 is supplied, a catalytic gas GA2 may be additionally supplied. The catalytic gas GA2 may be supplied at a flow rate of about 0 sccm to about 300 sccm. The catalytic gas GA2 may be, for example, hydrogen, not being limited thereto. The catalytic gas GA2 may serve as a catalyst when the second chalcogen atoms X2 are substituted for the first chalcogen atoms X1 in a subsequent operation.

In (b) state of FIG. 3A, the first chalcogen atoms X1 positioned on the first portion PR1 of the first material layer SL1 may be replaced by the second chalcogen atoms X2 to form a second material layer SL2 of a second conductivity type opposite to the first conductivity type (S30 in FIG. 1). The second material layer SL2 may be formed by chemical vapor transition (CVT).

The first material layer SL1 may be a two-dimensional material, and a bonding force between the first chalcogen atoms X1 and the first transition metal atoms M may be greater on a top surface of the first material layer SL1 than on a lateral surface of the first material layer SL1. For example, on the lateral surface of the first material layer SL1, there may be a weak bonding force between the first chalcogen atoms X1 and the first transition metal atoms M.

Therefore, on the lateral surface of the first material layer SL1, the first chalcogen atoms X1 may be easily separated, and the second chalcogen atoms X2 may be bonded to positions from which the first chalcogen atoms X1 are separated. Alternatively, reactivity between the second chalcogen atoms X2 and the first transition metal atoms M may be greater on the lateral surface of the first material layer SL1 than on the top surface of the first material layer SL1.

The second material layer SL2 may include first transition metal atoms M and second chalcogen atoms X2, according to an embodiment. The first transition metal atoms M may be one of tungsten (W), and molybdenum (Mo), not being limited thereto. The second conductivity type may be, for example, a p-type. The second chalcogen atoms X2 may be selenium (Se), not being limited thereto. The second material layer SL2 may include the second chalcogen atoms X2 of which an amount does not satisfy a stoichiometric ratio, according to an embodiment. The second material layer SL2 may be one of $MoSe_c$ and $WSe_d$, not being limited thereto, where subscripts c and d may independently be a positive real number equal to or less than 2, according to an embodiment. When the subscripts c and d are less than 2, the second material layer SL2 may have an increased amount of holes to exhibit stronger p-type conductivity The second material layer SL2 may be called a second two-dimensional material layer, a second two-dimensional semiconductor material layer, a second semiconductor layer, or a second TMD layer.

The first material layer SL1 and the second material layer SL2 may constitute a PN junction structure PNST. The PN junction structure PNST may form a diode, a well region of transistor, source/drain regions of transistor, a photoelectric conversion part of image sensor, or any other semiconductor element.

Figure 4:
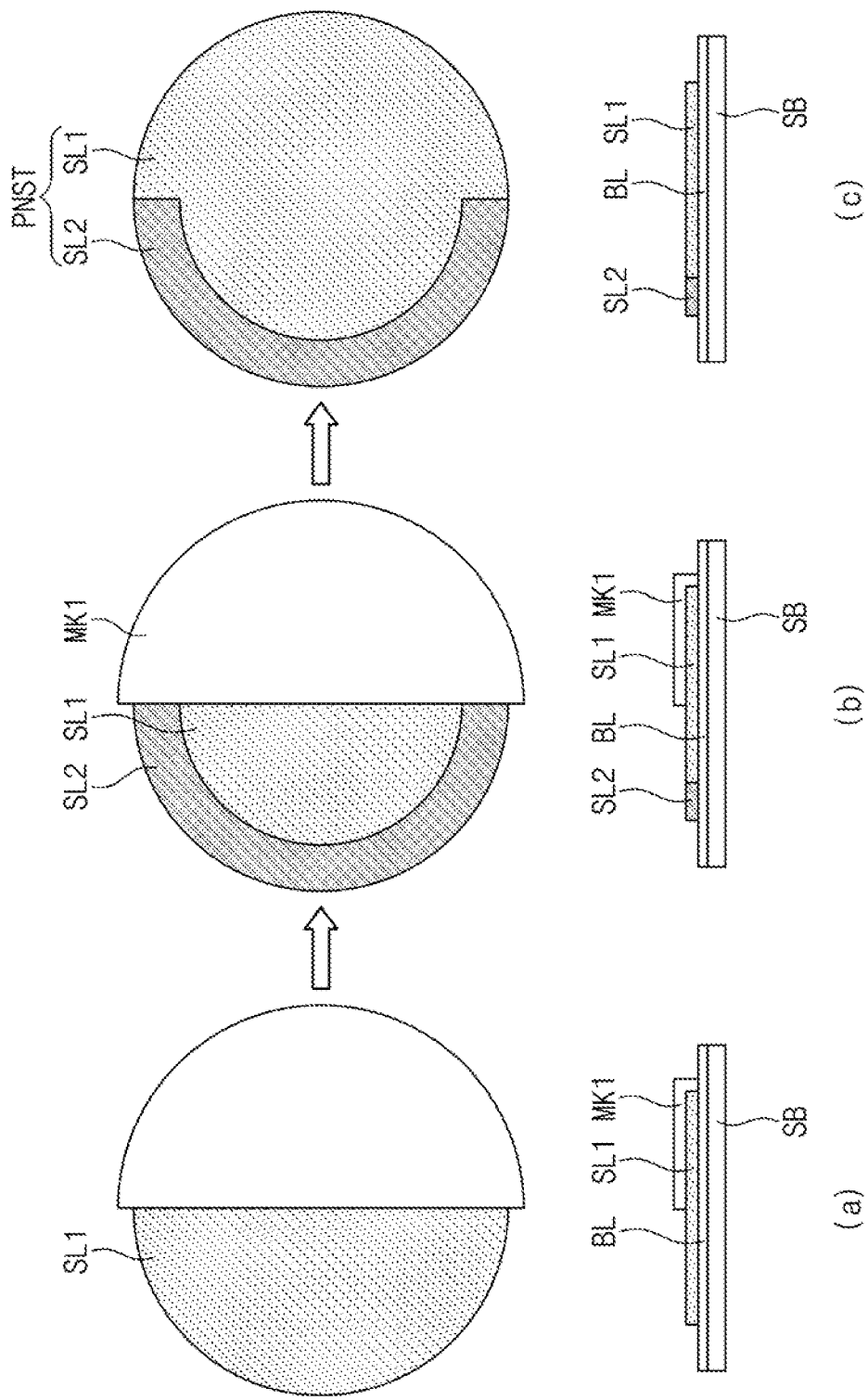
FIG. 4 illustrates a state change in forming a PN junction, according to an embodiment.

FIG. 4 illustrates a state change in forming a PN junction, according to an embodiment.

In (a) state of FIG. 4, corresponding to (a) state of FIG. 3A, before the second material layer SL2 is formed, a first mask pattern MK1 may be formed on a portion of the first material layer SL1. The first mask pattern MK1 may partially cover top and lateral surfaces of the first material layer SL1. In this state, the first material layer SL1 may be loaded into the process chamber CB of FIG. 2. The first mask pattern MK1 may include at least one selected from aluminum oxide, silicon oxide, silicon oxynitride, silicon nitride, and photoresist patterns. As discussed with reference to FIGS. 1 and 2, the gas of the second chalcogen atoms X2 may be supplied to a position around the first material layer SL1. Therefore, in (b) state of FIG. 4, on an edge of the first material layer SL1 exposed without being covered with the first mask pattern MK1, the first chalcogen atoms X1 may be replaced by the second chalcogen atoms X2 to form the second material layer SL2. Subsequently, the first mask pattern MK1 may be removed as shown in (c) state of FIG. 4. The second material layer SL2 may be formed on a portion of the edge of the first material layer SL1.

EXPERIMENTAL EXAMPLE

A silicon wafer having a size of about 1 cm×1 cm is prepared as the substrate SB, and a silicon layer is deposited to about 90 nm as the buffer layer BL on the substrate SB. A $WS_2$ layer is formed as the first material layer SL1 on the buffer layer BL. The $WS_2$ layer is formed by using a tape to obtain flakes (thin slice) from the $WS_2$ powder. On the $WS_2$ layer, an $Al_2O_3$ layer is formed as the first mask pattern MK1 to cover a portion of the $WS_2$ layer.

The substrate SB is loaded into a chemical vapor deposition (CVD) chamber as the process chamber CB, and selenium powder as the source layer X2L is positioned on a side of the substrate SB. Nitrogen ($N_2$), or the carrier gas GA1, is supplied at a flow rate of about 1,000 sccm. In an initial state of process, the CVD chamber has a temperature of about 25° C. at a central portion thereof, and the catalytic gas GA2 is not yet supplied. For example, the catalytic gas GA2 is supplied at a flow rate of 0 sccm. The CVD chamber is heated to allow its central portion to become about 700° C. Therefore, the source layer X2L is heated at a temperature of about 330° C. or higher to cause selenium to begin evaporation. In this state, nitrogen ($N_2$) as the carrier gas GA1 is supplied at a flow rate of about 250 sccm, and hydrogen ($H_2$) as the catalytic gas GA2 is supplied at a flow rate of about 30 sccm. Thus, the evaporated selenium gas moves to the $WS_2$ layer or the first material layer SL1, thereby reacting with $WS_2$. A sulfur (S) atom of $WS_2$ is replaced by a selenium (Se) atom to form the second material layer SL2 formed of $WSe_2$. In this case, because reactivity with the selenium (Se) atom is greater on a lateral surface of the $WS_2$ layer, reaction with the selenium (Se) atom may begin from the lateral surface of the $WS_2$ layer.

Figure 5:
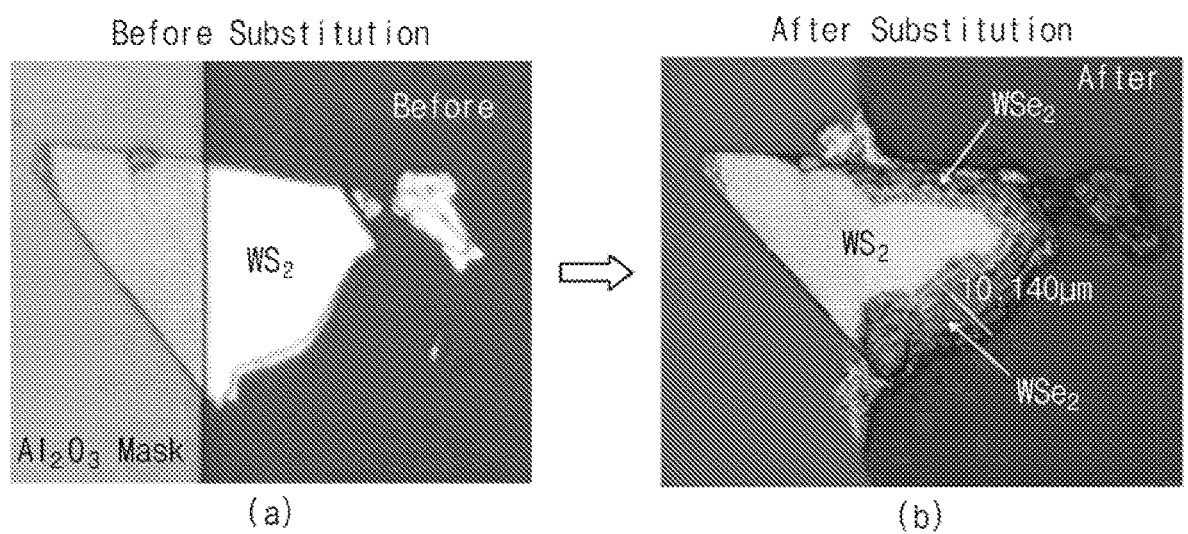
FIG. 5 illustrates a picture showing a result of an experimental example according to an embodiment.

An increase in process time induces an increase in distance required for replacement by the selenium (Se) atom in an inward direction from the lateral surface of the $WS_2$ layer, and accordingly it is possible to eventually accomplish cylindrical substitution of $WSe_2$ in the outside of the $WS_2$ layer while $WS_2$ remains in the inside of the $WS_2$ layer as shown in FIG. 3A. This is captured as shown in FIG. 5. FIG. 5 illustrates a picture showing a result of this experimental example. Referring to FIG. 5, it is ascertained that the $WS_2$ layer as the mask pattern MK1 has a lateral surface which is not covered with an $Al_2O_3$ layer in (a) state, and which is replaced by $WSe_2$ in (b) state.

A method of forming a PN junction structure according to the present embodiment may use TMD that is a two-dimensional semiconductor material. When the TMD is applied to a semiconductor device, the semiconductor device may increase operating speed.

In a method of forming a PN junction structure according to the present embodiment chemical vapor transition (CVT) may be performed such that a portion of the first material layer SL1 is replaced by the second material layer SL2, and thus, a uniform even contact interface instead of an uneven contact interface may be provided between the first material layer SL1 and the second material layer SL2. Accordingly, it may be possible to fabricate a semiconductor device of which electrical reproduction is excellent.

Moreover, in a method of forming a PN junction structure according to an embodiment, chemical vapor transition (CVT) may be applicable to a large wafer-level fabrication, and thus, it may be possible to securely obtain industrial applicability and mass production.

Furthermore, in a method of forming a PN junction structure according to the present embodiment, the first mask pattern MK1 may be used to form the second material layer SL2 at a selected position. As a result, it may be possible to easily fabricate semiconductor devices having various structures.

FIGS. 6A-6E illustrate a method of fabricating a semiconductor device according to embodiments.

Figure 6A:
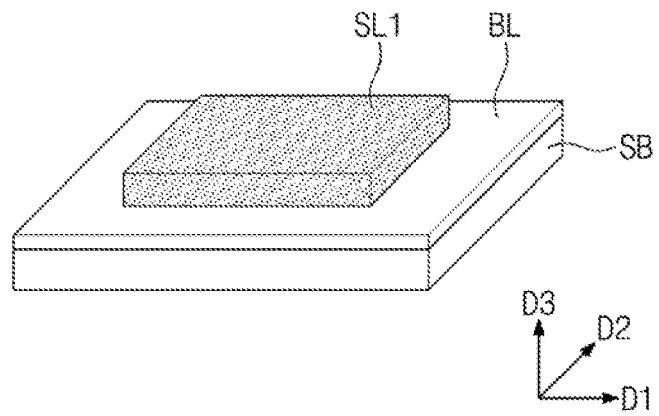
FIGS. 6A-6E illustrate a method of fabricating a semiconductor device according to embodiments.

Referring to FIG. 6A, a buffer layer BL may be formed on a substrate SB, and a first material layer SL1 may be formed on the buffer layer BL.

Figure 6B:
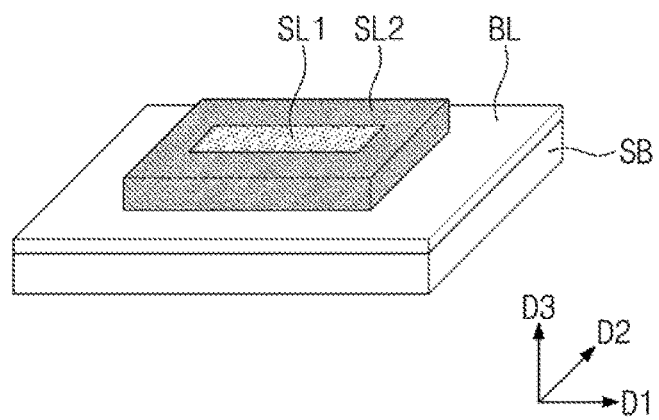

Referring to FIG. 6B, chemical vapor transition (CVT) may be performed to substitute a second material layer SL2 for an edge, outside or circumference portion of the first material layer SL1.

Figure 6C:
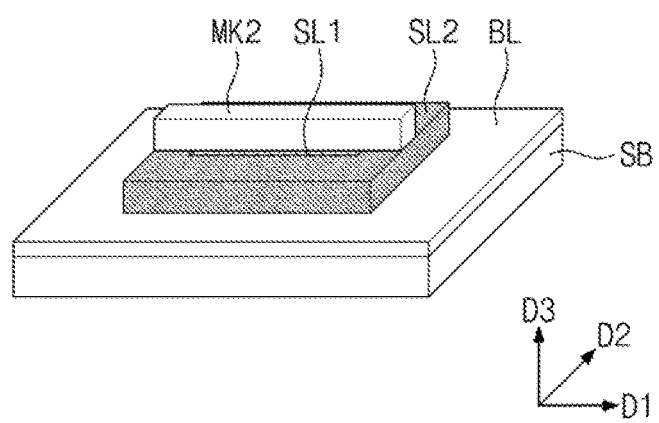

Referring to FIG. 6C, a second mask pattern MK2 may be formed on the first material layer SL1 and the second material layer SL2. The second mask pattern MK2 may include at least one of a photoresist pattern, silicon nitride, metal oxide and polysilicon, not being limited thereto. The second mask pattern MK2 may be formed to run across the first material layer SL1 and the second material layer SL2. For example, the second mask pattern MK2 may be formed to cover at least a portion of the first material layer SL1 and a portion of the second material layer SL2 contacting the portion of the first material layer SL1 covered by the second mask pattern MK2.

Figure 6D:
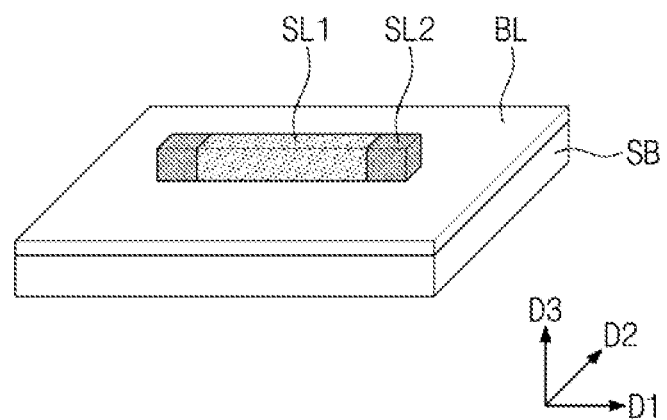

Referring to FIG. 6D, the second mask pattern MK2 may be used as an etching mask to remove or etch the second material layer SL2 positioned on a side of the second mask pattern MK2, thereby exposing the buffer layer BL. For example, another portion of the second material layer SL2 not covered by the second mask pattern MK2 may be removed or etched.

Figure 6E:
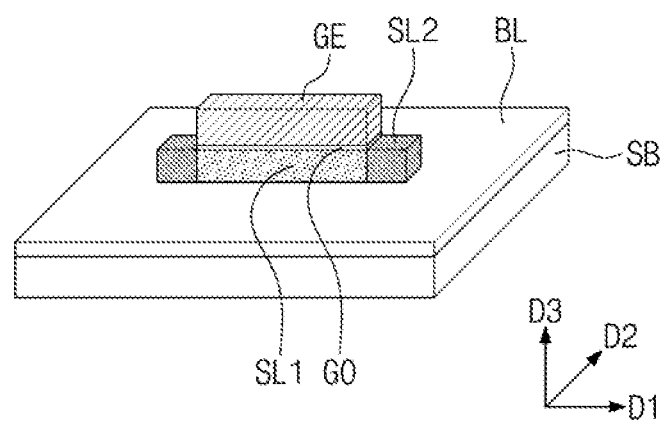

Referring to FIG. 6E, a gate dielectric layer GO and a gate electrode GE may be formed on the first material layer SL1. Therefore, a transistor may be formed which includes the gate electrode GE. In FIG. 6E, the first material layer SL1 may be used as a channel of the transistor, and the second material layer SL2 may be used as source/drain regions of the transistor.

The first material layer SL1 may include first transition metal atoms M and first chalcogen atoms X1, according to an embodiment. The first transition metal atoms M may be one of tungsten (W), and molybdenum (Mo), not being limited thereto. The first chalcogen atoms X1 may be sulfur (S), not being limited thereto. The first material layer SL1 may include the first chalcogen atoms X1 of which an amount does not satisfy a stoichiometric ratio. The first material layer SL1 may be one of $MoS_a$, and $WS_b$, not being limited thereto, where subscripts a and b may independently be a positive real number equal to or less than 2, according to an embodiment. The first material layer SL1 may be a first conductivity type. The first conductivity type may be an n-type, for example.

The second material layer SL2 may include first transition metal atoms M and second chalcogen atoms X2, according to an embodiment. The first transition metal atoms M may be tungsten (W), molybdenum (Mo), etc., not being limited thereto. The second material layer SL2 may be a second conductivity type opposite to the first conductivity type. The second conductivity type may be, for example, a p-type. The second chalcogen atoms X2 may be selenium (Se), not being limited thereto. The second material layer SL2 may include the second chalcogen atoms X2 of which an amount does not satisfy a stoichiometric ratio. The second material layer SL2 may be one of MoSec and WSed, not being limited thereto, where subscripts c and d may independently be a positive real number equal to or less than 2. Other configurations, materials, and processes may be the same as those discussed above.

A semiconductor device according to the above embodiment may include a two-dimensional material, or TMD, on a channel region and source/drain regions thereof. The TMD may have excellent on/off ratio properties and superior carrier mobility. Accordingly, the semiconductor device may have improved operating speed.

Differently from FIG. 6E, the gate dielectric layer GO and the gate electrode GE may each have a linear shape that extends in a second direction D2, and may cover a lateral surface of the first material layer SL1 and a top surface of the buffer layer BL. The gate dielectric layer GO may include at least one selected from silicon oxide, silicon nitride, silicon oxynitride and metal oxide. The gate electrode GE may include at least one selected from impurity-doped polysilicon, metal silicide, metal nitride and metal.

FIGS. 7A-7D illustrate a method of fabricating a semiconductor device, according to embodiments.

Figure 7A:
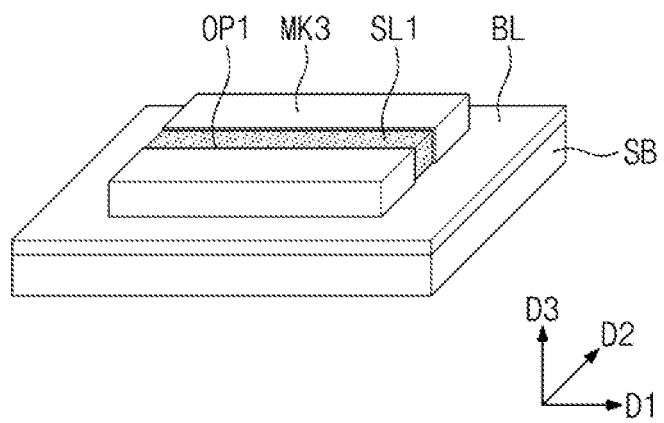
FIGS. 7A-7D illustrate a method of fabricating a semiconductor device, according to embodiments.

Referring to FIG. 7A, a buffer layer BL may be formed on a substrate SB. Similar to FIG. 6A, a first material layer SL1 may be formed on the buffer layer BL. A third mask pattern MK3 may be formed on the first material layer SL1. The third mask pattern MK3 may be formed to run across a center of the first material layer SL1 and have a first opening OP1 elongated in a first direction D1. The third mask pattern MK3 may be formed of, for example, aluminum oxide.

Figure 7B:
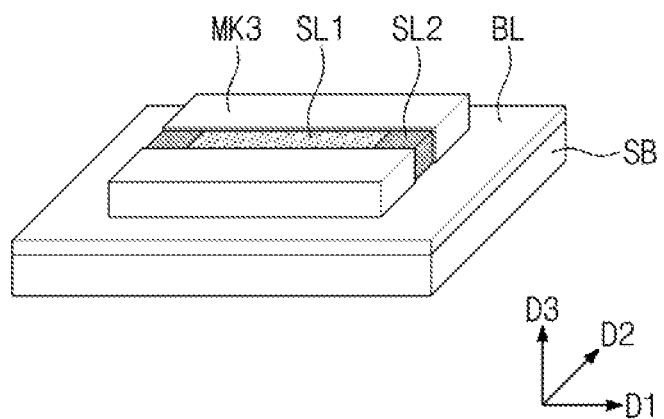

Referring to FIG. 7B, a second material layer SL2 may be substituted for two opposite edge portions of the first material layer SL1 exposed through the first opening OP1 of the third mask pattern MK3.

Figure 7C:
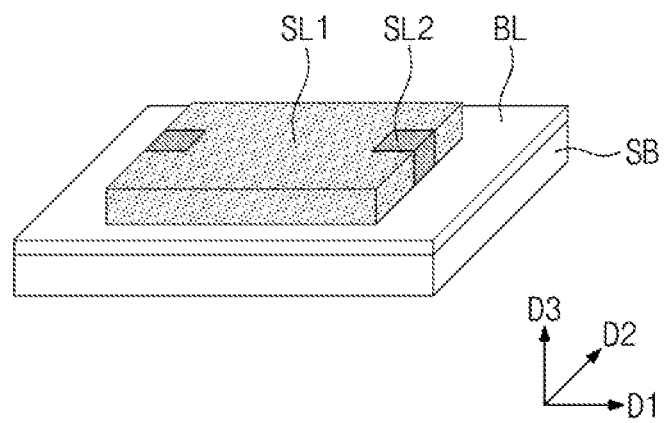

Referring to FIG. 7C, the third mask pattern MK3 may be removed. Therefore, the second material layer SL2 may be formed at each of the two opposite edge portions of the first material layer SL1.

Figure 7D:
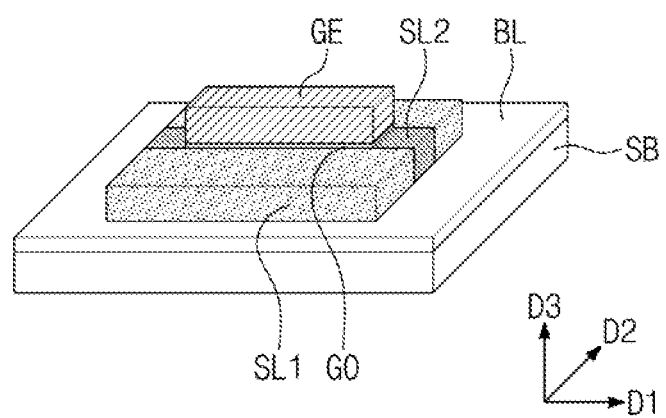

Referring to FIG. 7D, a gate dielectric layer GO and a gate electrode GE may be formed on the first material layer SL1 between the second material layers SL2. Other configurations, materials, and processes may be the same as those discussed above.

Figure 8:
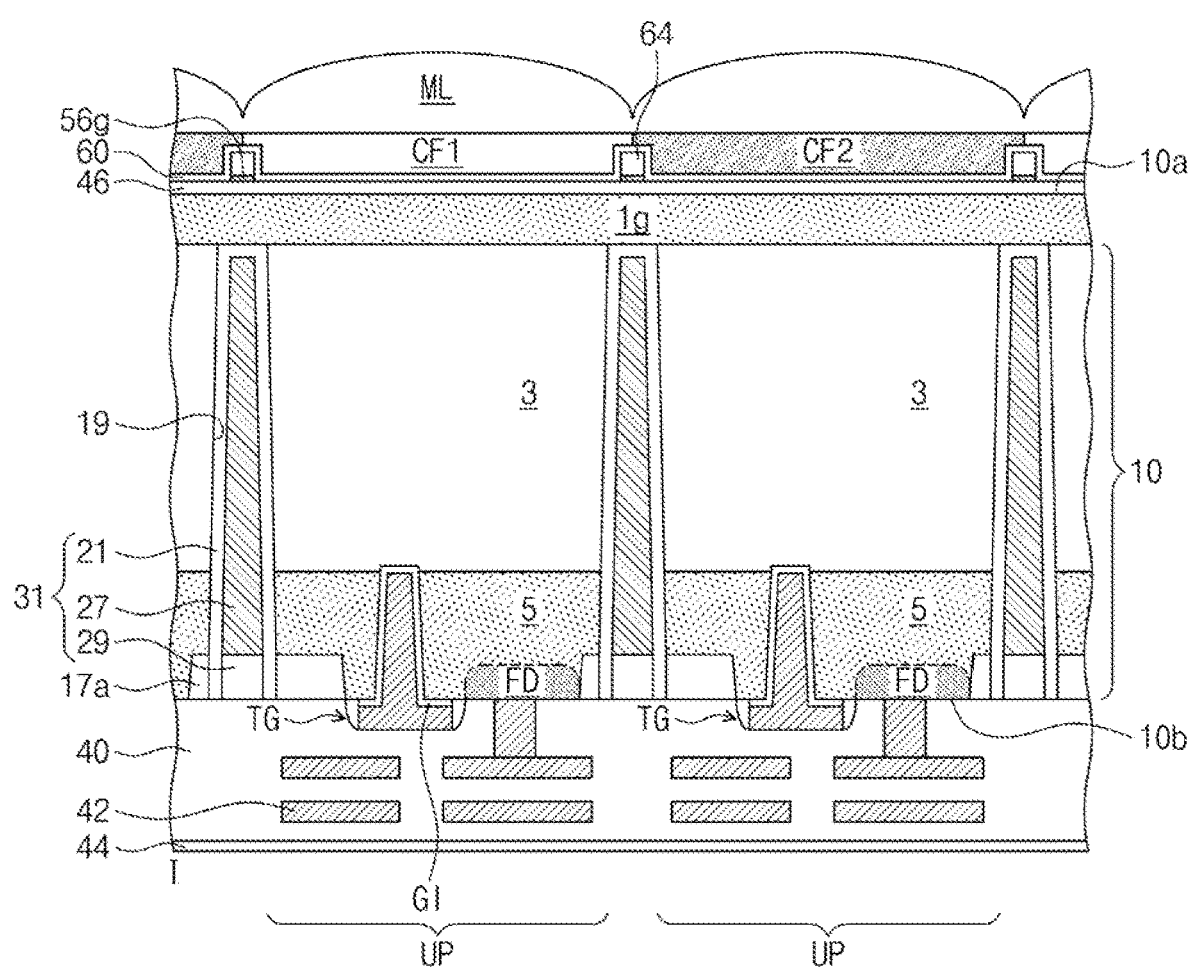
FIG. 8 illustrates a cross-sectional view showing an image sensor according to embodiments.

FIG. 8 illustrates a cross-sectional view showing an image sensor, according to embodiments.

Referring to FIG. 8, an image sensor according to the present embodiment may include a first substrate 10. The first substrate 10 may have a first surface 10a and a second surface 10b that are opposite to each other. The first substrate 10 may include a plurality of unit pixels UP.

The first substrate 10 may include a first material layer 1g, a second material layer 3, and a third material layer 5 that are stacked in a direction from the first surface 10a toward the second surface 10b. For example, the first material layer 1g, the second material layer 3, and the third material layer 5 may each be a two-dimensional material layer or a TMD layer.

The second material layer 3 may include first transition metal atoms M and first chalcogen atoms X1. The first transition metal atoms M may be one of tungsten (W), and molybdenum (Mo), not being limited thereto. The first chalcogen atoms X1 may be sulfur (S), not being limited thereto. The second material layer 3 may include the first chalcogen atoms X1 of which an amount does not satisfy a stoichiometric ratio. The second material layer 3 may be $MoS_a$, and $WS_b$, not being limited thereto, where subscripts a and b may independently be a positive real number equal to or less than 2. The second material layer 3 may be a first conductivity type. The first conductivity type may be an n-type.

The first material layer 1g and the third material layer 5 may each include first transition metal atoms M and second chalcogen atoms X2. The first transition metal atoms M may be one of tungsten (W) and molybdenum (Mo), not being limited thereto. The first material layer 1g and the third material layer 5 may each be a second conductivity type opposite to the first conductivity type. The second conductivity type may be, for example, a p-type. The second chalcogen atoms X2 may be selenium (Se), not being limited thereto. The first material layer 1g and the third material layer 5 may each include the second chalcogen atoms X2 of which an amount does not satisfy a stoichiometric ratio. The first material layer 1g and the third material layer 5 may each be at least one of MoSe$_c$ and WSe$_d$, not being limited thereto, where subscripts c and d may independently be a positive real number equal to or less than 2.

The first surface 10a may correspond to a top surface of the first material layer 1g, and the second surface 10b may correspond to a bottom surface of the third material layer 5.

The first substrate 10 may be provided therein with a pixel isolation part 31 by which a plurality of unit pixels UP are separated from each other. The pixel isolation part 31 may serve to prevent crosstalk between neighboring unit pixels UP. The pixel isolation part 31 may penetrate from the second surface 10b through the third and second material layers 5 and 3, thereby contacting the first material layer 1g.

On each of the unit pixels UP, a PN junction may be constituted by the second material layer 3 and the first material layer 1g and/or by the second material layer 3 and the third material layer 5, and thus, a photodiode may be provided by the PN junction. The second material layer 3 may serve as a photoelectric conversion part. On each of the unit pixels UP, the third material layer 5 may serve as a well region. The pixel isolation part 31 may have a width that decreases in a direction from the second surface 10b toward the first surface 10a.

The pixel isolation part 31 may include an isolation conductive pattern 27, an isolation dielectric layer 21, and a buried dielectric pattern 29. The isolation conductive pattern 27 may penetrate the third material layer 5 and the second material layer 3. The isolation dielectric layer 21 may be interposed between the isolation conductive pattern 27 and the first substrate 10. The isolation dielectric layer 21 may also be interposed between the isolation conductive pattern 27 and the first material layer 1g. The buried dielectric pattern 29 may be interposed between the second surface 10b and the isolation conductive pattern 27. The isolation conductive pattern 27 may include, for example, one or more of metal and impurity-doped polysilicon. A negative bias voltage may be applied to the isolation conductive pattern 27. Therefore, it may be possible to prevent or reduce white spot and/or dark current. The isolation dielectric layer 21 and the buried dielectric pattern 29 may each include, for example, silicon oxide.

A device isolation pattern 17a may be disposed adjacent to the second surface 10b of the substrate 10, and may define active regions on the unit pixels UP. The device isolation pattern 17a may have a single-layered or multi-layered structure formed of, for example, at least one of silicon oxide, silicon nitride and silicon oxynitride.

A transfer gate electrode TG may correspond to a gate of a transfer transistor. A portion of the transfer gate electrode TG may penetrate the third material layer 5. Another portion of the transfer gate electrode TG may protrude from the second surface 10b and may be formed on the second surface 10b. The transfer gate electrode TG may be a vertical type gate. A floating diffusion region FD may be disposed on a side of the transfer gate electrode TG. The floating diffusion region FD may be disposed in the third material layer 5.

The floating diffusion region FD may include first transition metal atoms M and first chalcogen atoms X1. The first transition metal atoms M may be one of tungsten (W) and molybdenum (Mo), not being limited thereto. The first chalcogen atoms X1 may be sulfur (S), not being limited thereto. The floating diffusion region FD may include the first chalcogen atoms X1 of which an amount does not satisfy a stoichiometric ratio. The floating diffusion region FD may be one of MoS$_a$ and WS$_b$, not being limited thereto, where subscripts a and b may independently be a positive real number equal to or less than 2. The floating diffusion region FD may be a first conductivity type. The first conductivity type may be an n-type, for example.

A gate dielectric layer GI may be interposed between the transfer gate electrode TG and the third material layer 5. The gate dielectric layer GI may include, for example, one or more of silicon oxide and silicon nitride.

At least a portion of the second surface 10b may be covered with an interlayer dielectric layer 40. The interlayer dielectric layer 40 may have a multi-layered structure formed of at least one of silicon oxide, silicon nitride, silicon oxynitride, SiCN, tetraethyl orthosilicate (TEOS) and porous dielectric. The interlayer dielectric layer 40 may be provided therein with multi-layered wiring lines 42. At least a portion of the interlayer dielectric layer 40 may be covered with a first protection layer 44. For example, the protection layer 44 may include silicon oxide.

At least a portion of the first material layer 1g may be covered with an antireflection layer 46. The first material layer 1g may be in contact with the antireflection layer 46. The antireflection layer 46 may include, for example, silicon oxide. Although not shown, a planarization layer may be additionally disposed on the antireflection layer 46.

The antireflection layer 46 may be provided thereon with a light-shield grid pattern 56g and a low-refraction pattern 64. Each of the light-shield grid pattern 56g and the low-refraction pattern 64 may overlap the pixel isolation part 31, and may have a network shape when viewed in plan. The light-shield grid pattern 56g may include metal, such as titanium or tungsten. The antireflection layer 46 and the low-refraction pattern 64 may be conformally covered with a second protection layer 60. The second protection layer 60 may have a single-layered or multi-layered structure formed of at least one of silicon oxide, silicon nitride, aluminum oxide and hafnium oxide, not being limited thereto.

The low-refraction pattern 64 may include an organic material. The low-refraction pattern 64 may have a refractive index less than those of color filters CF1 and CF2. For example, the low-refraction pattern 64 may have a refractive index of equal to or less than about 1.3. A sidewall of the low-refraction pattern 64 may be aligned with that of the light-shield grid pattern 56g. The light-shield grid pattern 56g and the low-refraction pattern 64 may prevent crosstalk between neighboring unit pixels UP.

On the unit pixels UP, the color filters CF1 and CF2 may be disposed between the low-refraction patterns 64. Each of the color filters CF1 and CF2 may have one of blue, green, and red colors. The color filters CF1 and CF2 may be arranged in one of Bayer pattern, 2×2 Tetra pattern, and 3×3 Nona pattern. Alternatively, the color filters CF1 and CF2 may include different colors such as cyan, magenta, or yellow.

On the unit pixels UP, a microlens array layer ML may be disposed on the color filters CF1 and CF2. The microlens array layer ML may include convex lenses that correspondingly overlap the unit pixels UP.

Figure 9A:
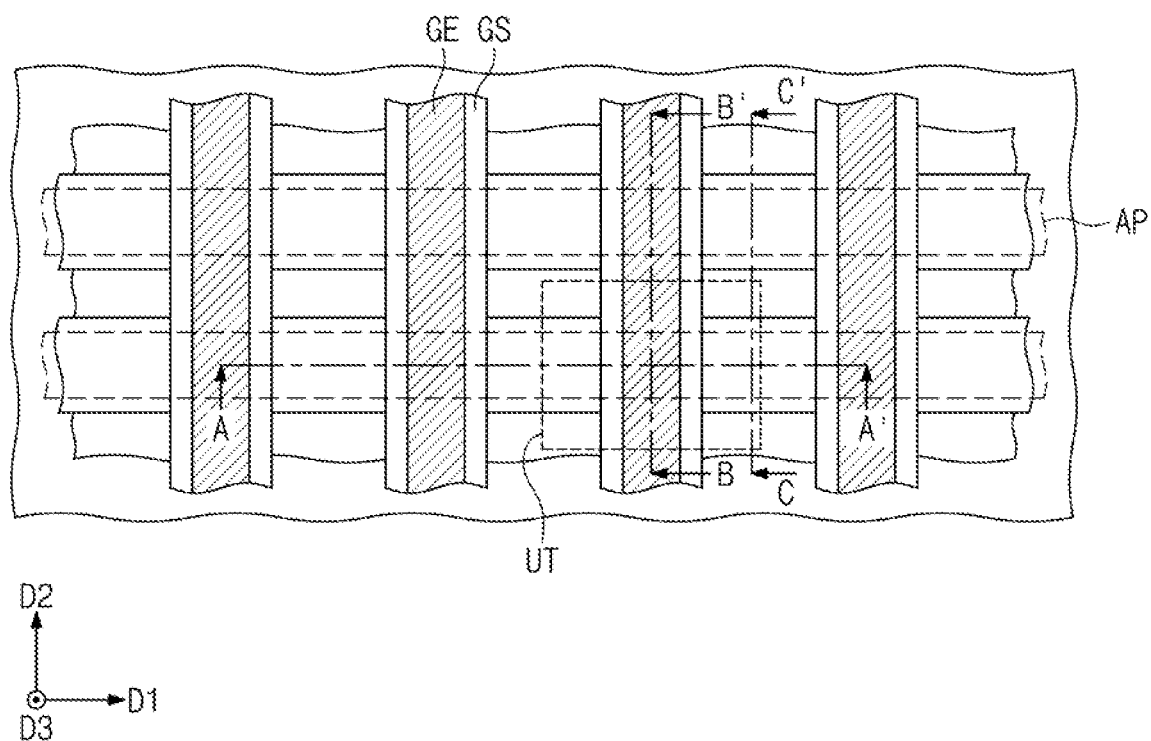
FIG. 9A illustrates a plan view showing a semiconductor device, according to an embodiment.
Figure 9B:
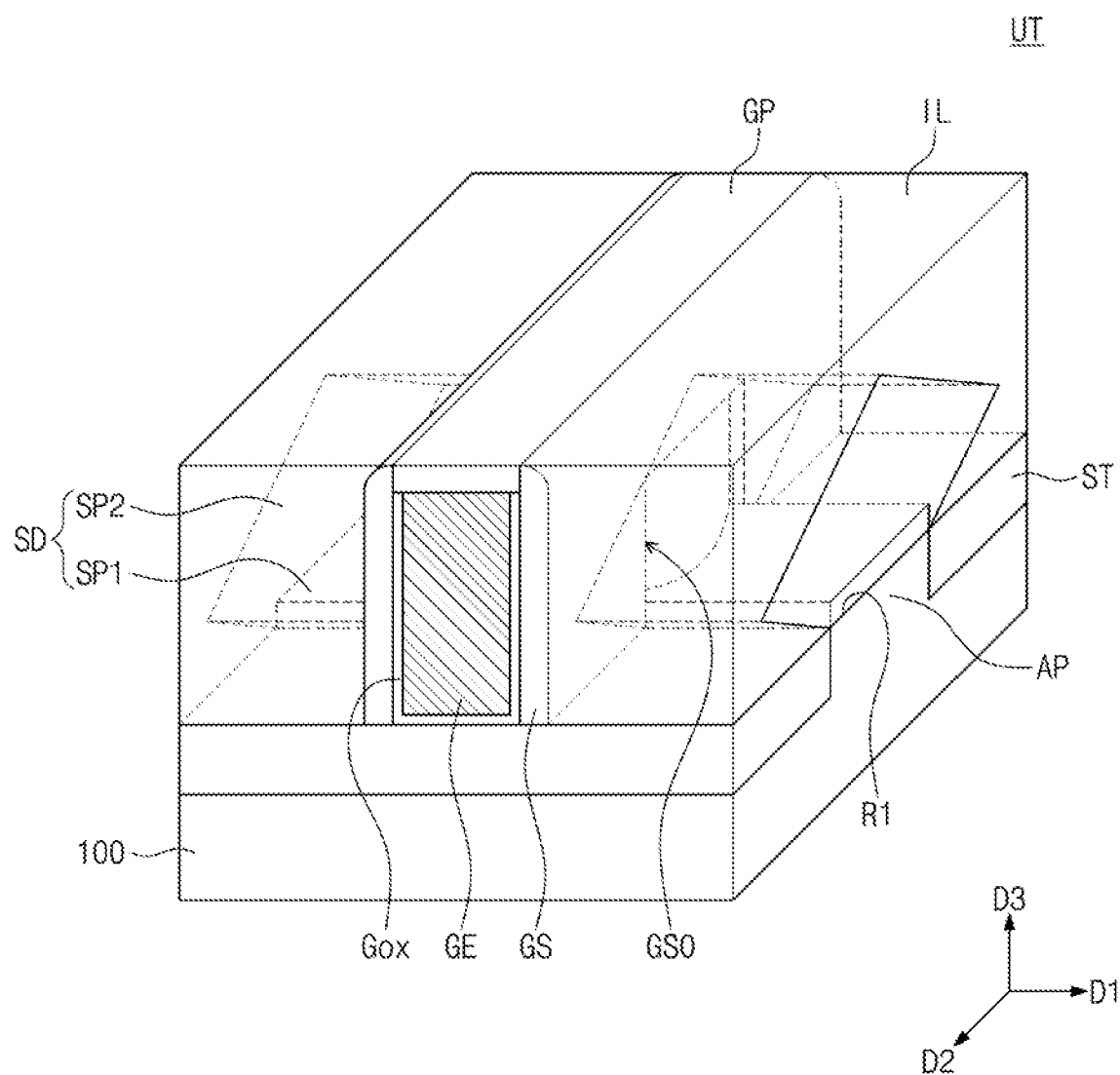
FIG. 9B illustrates a perspective view showing a unit transistor UT of FIG. 9A, according to an embodiment.
Figure 9C:
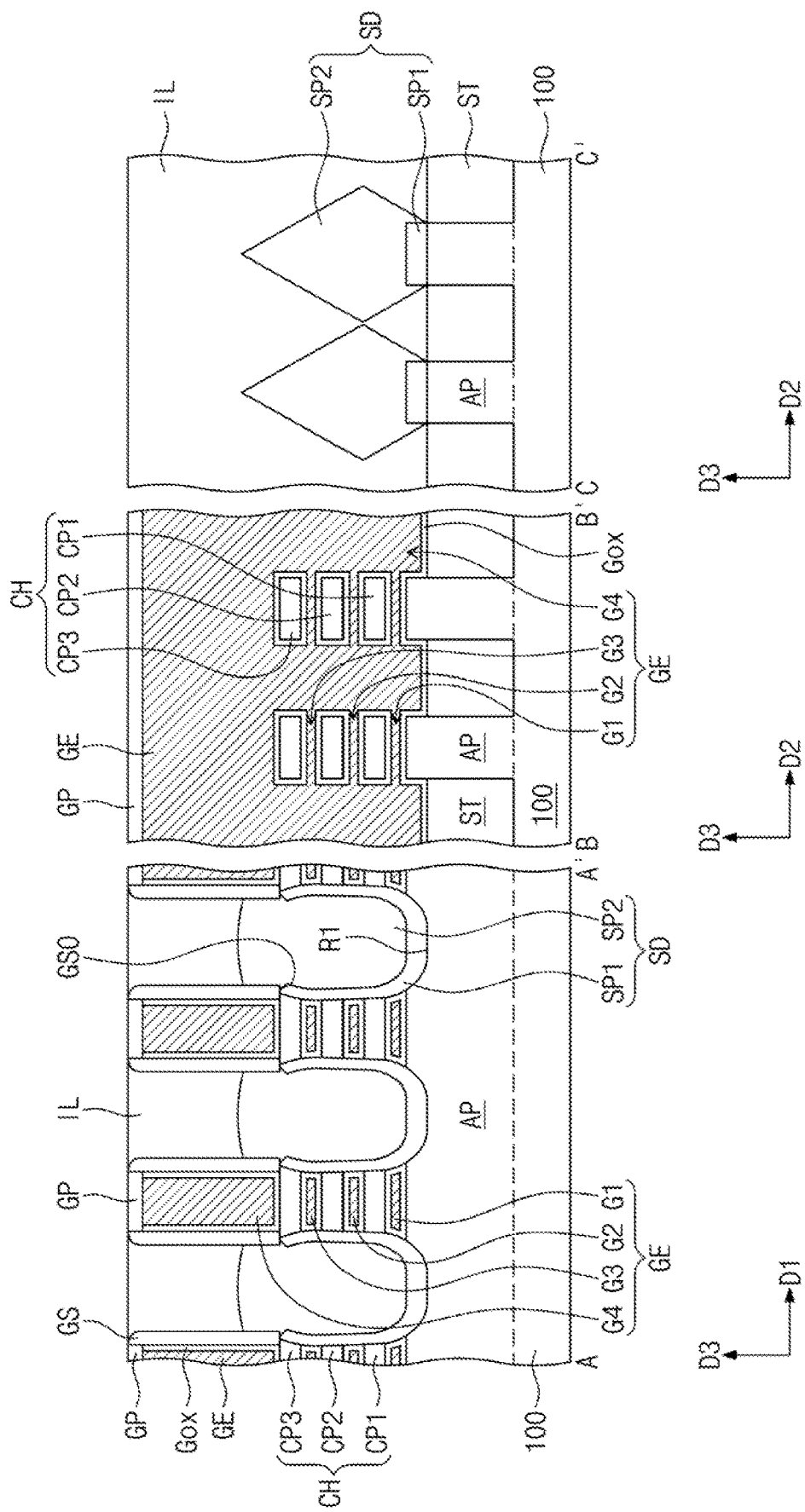
FIG. 9C illustrates a cross-sectional view taken along lines A-A', B-B' and C-C' of FIG. 1, according to embodiments.

FIG. 9A illustrates a plan view showing a semiconductor device, according to an embodiment. FIG. 9B illustrates a perspective view showing a unit transistor UT of FIG. 9A, according to an embodiment. FIG. 9C illustrates a cross-sectional view taken along lines A-A', B-B' and C-C' of FIG. 1, according to embodiments.

Referring to FIGS. 9A to 9C, a substrate 100 may be provided. Active patterns AP may protrude from the substrate 100. The active patterns AP may each have a bar or linear shape elongated in a first direction D1. The active patterns AP may be spaced apart from each other in a second direction D2 that intersects the first direction D1. A device isolation layer ST may be disposed on the substrate 100 on sides of the active patterns AP. The device isolation layer ST may include a dielectric material. The device isolation layer ST may be formed to have a single-layered or multi-layered structure formed of at least one of a silicon oxide layer, a silicon nitride layer, a silicon oxynitride layer, and a metal oxide layer. The device isolation layer ST may have a top surface at a height the same as or lower than that of top surfaces of the active patterns AP.

A plurality of gate electrodes GE may extend in the second direction D2 to run across the active patterns AP. The gate electrodes GE may be spaced apart from each other in the first direction D1. The gate electrode GE may include a work-function pattern and a metal line pattern.

The work-function pattern may be an n-type work-function pattern or a p-type work-function pattern. The n-type work-function pattern may include at least one selected from lanthanum (La), lanthanum oxide (LaO), tantalum (Ta), tantalum nitride (TaN), niobium (Nb) and titanium nitride (TiN). The p-type work-function pattern may include at least one selected from aluminum (Al), aluminum oxide ($Al_2O_3$), titanium nitride (TiN), tungsten nitride (WN) and ruthenium oxide ($RuO_2$). The metal line pattern may include at least one selected from tungsten (W), copper (Cu) and aluminum (Al). The gate electrode GE may further include a diffusion stop pattern between the work-function pattern and the metal line pattern. The diffusion stop pattern may include a metal nitride layer, such as a titanium nitride layer, a tantalum nitride layer and a tungsten nitride layer.

A gate capping pattern GP may be disposed on an upper portion of the gate electrode GE. The gate capping pattern GP may be formed of, for example, a silicon nitride layer. A gate spacer GS may cover a sidewall of the gate electrode GE and a sidewall of the gate capping pattern GP. The gate spacer GS may have a single-layered or multi-layered structure formed of at least one of a silicon nitride layer a silicon oxide layer and a silicon oxynitride layer.

A channel pattern CH may be disposed between the gate electrode GE and the active pattern AP. The channel pattern CH may include first, second and third semiconductor patterns CP1, CP2 and CP3 that are stacked on the active pattern AP. The first, second, and third semiconductor patterns CP1, CP2 and CP3 may be spaced apart from each other. The first, second and third semiconductor patterns CP1, CP2 and CP3 may include, for example, silicon. The gate electrode GE may surround top, bottom and lateral surfaces of the channel pattern CH.

The substrate 100 and the first to third semiconductor patterns CP1 to CP3 may each include first transition metal atoms M and first chalcogen atoms X1. The first transition metal atoms M may be one of tungsten (W) and molybdenum (Mo), not being limited thereto. The first chalcogen atoms X1 may be sulfur (S), not being limited thereto. The substrate 100 and the first to third semiconductor patterns CP1 to CP3 may each include the first transition metal atoms M of which an amount does not satisfy a stoichiometric ratio. The substrate 100 and the first to third semiconductor patterns CP1 to CP3 may each be one of $MoS_a$ and $WS_b$, not being limited thereto, where subscripts a and b may independently be a positive real number equal to or less than 2.

Alternatively, the substrate 100 and the first to third semiconductor patterns CP1 to CP3 may each include first transition metal atoms M and second chalcogen atoms X2. The first transition metal atoms M may be one of tungsten (W) and molybdenum (Mo), not being limited thereto. The second chalcogen atoms X2 may be selenium (Se), not being limited thereto. The substrate 100 and the first to third semiconductor patterns CP1 to CP3 may each include the second chalcogen atoms X2 of which an amount does not satisfy a stoichiometric ratio. The substrate 100 and the first to third semiconductor patterns CP1 to CP3 may each be one of $MoSe_c$ and $WSe_d$, where subscripts c and d may independently be a positive real number equal to or less than 2.

Alternatively, the substrate 100 may be formed of monocrystalline silicon. The first, second and third semiconductor patterns CP1, CP2 and CP3 may have their central portions each of which includes first transition metal atoms M and first chalcogen atoms X1. In addition, the first, second and third semiconductor patterns CP1, CP2 and CP3 may have their edges or ends each of which includes first transition metal atoms M and second chalcogen atoms X2.

The gate electrode GE may include first, second, third and fourth gate segments G1, G2, G3 and G4 that are integrally connected into a single unitary body. The first gate segment G1 may be positioned between the active pattern AP and the first semiconductor pattern CP1. The second gate segment G2 may be positioned between the first semiconductor pattern CP1 and the second semiconductor pattern CP2. The third gate segment G3 may be positioned between the second semiconductor pattern CP2 and the third semiconductor pattern CP3.

A gate dielectric layer Gox may be interposed between the gate electrode GE and the channel pattern CH and between the gate electrode GE and the active pattern AP. The gate dielectric layer Gox may extend to intervene between the gate electrode GE and the gate spacer GS. The gate dielectric layer Gox may include one or more of a silicon oxide layer and a high-k dielectric layer whose dielectric constant is greater than that of a silicon oxide layer. The high-k dielectric layer may be formed of a material including, for example, one or more of hafnium oxide ($HfO_2$), hafnium silicate (HfSiO), hafnium oxynitride (HfON), hafnium silicon oxynitride (HfSiON), hafnium aluminum oxide ($HfAlO_3$), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), titanium oxide ($TiO_2$), barium strontium titanium oxide (BaSrTiO), barium titanium oxide (BaTiO), strontium titanium oxide (SrTiO), yttrium oxide (YO), aluminum oxide ($Al_2O_3$), tantalum oxide ($Ta_2O_3$) and lead scandium tantalum oxide (PbScTaO).

A sidewall of the channel pattern CH may not be covered with the gate spacer GS. The gate spacer GS may include a spacer opening GSO that exposes the channel pattern CH. The spacer opening GSO may expose the sidewall of the channel pattern CH and a sidewall of the gate dielectric layer Gox adjacent to the channel pattern CH. A recess region R1 may be formed on the active pattern AP adjacent to a side of the spacer opening GSO.

A source/drain pattern SD may be disposed in the recess region R1. The source/drain pattern SD may include a first source/drain pattern SP1 and a second source/drain pattern SP2. The first and second source/drain patterns SP1 and SP2 may include silicon or silicon-germanium. Each of the first and second source/drain patterns SP1 and SP2 may further include p-type or n-type impurities. Each of the first and second source/drain patterns SP1 and SP2 may further include boron, phosphorus, or arsenic. The first and second source/drain patterns SP1 and SP2 may have different amounts of germanium or impurities.

The unit transistor UT may be called a gate-all-around type transistor or a nanosheet transistor. Alternatively, the unit transistor UT may be called a multi-bridge channel field effect transistor (MBCFET).

A space between the gate electrodes GE may be filled with an interlayer dielectric layer IL. The interlayer dielectric layer IL may include at least one of a silicon oxide layer, a silicon nitride layer, a silicon oxynitride layer, and a porous layer. The interlayer dielectric layer IL may have a top surface coplanar with that of the gate capping pattern GP. The interlayer dielectric layer IL may be formed on upper sides of the second source/drain pattern SP2. The interlayer dielectric layer IL may also be formed on lower sides of the second source/drain pattern SP2 and the top surface of the device isolation layer ST. Although not shown, a contact plug may penetrate the interlayer dielectric layer IL to contact the second source/drain pattern SP2.

FIGS. 10A to 10F illustrate perspective views showing a method of fabricating a semiconductor device depicted in FIG. 9B, according to embodiments.

Figure 10A:
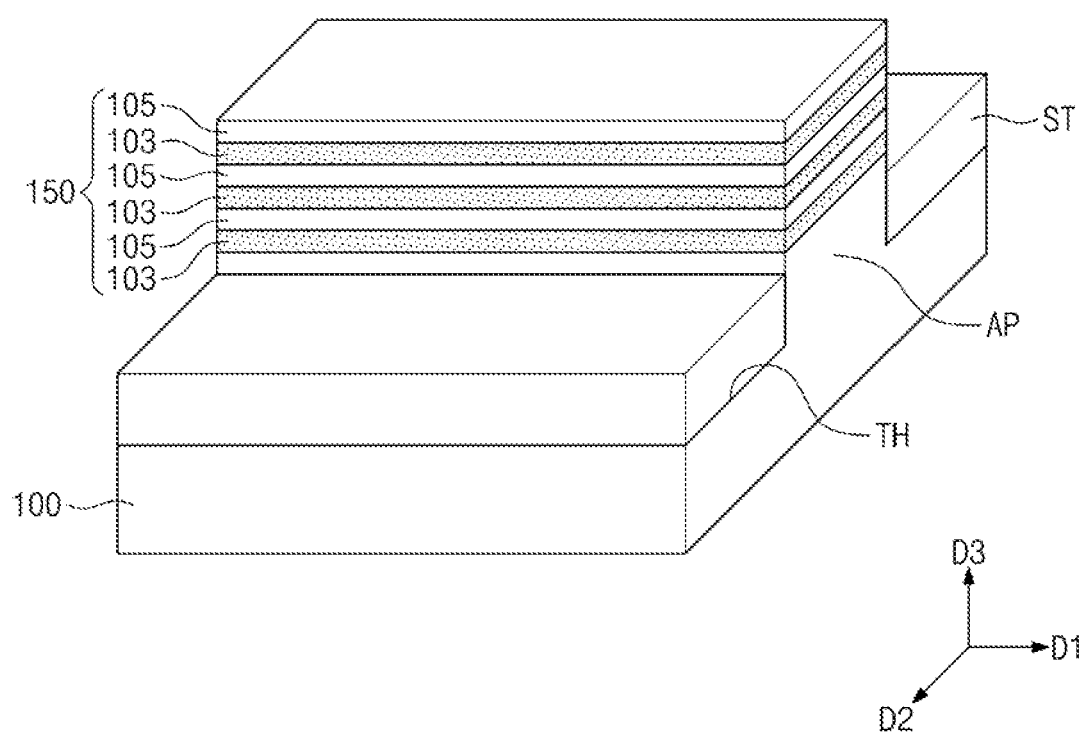
FIGS. 10A to 10F illustrate perspective views showing a method of fabricating a semiconductor device depicted in FIG. 9B, according to embodiments.

Referring to FIG. 10A, sacrificial layers 103 and semiconductor layers 105 may be alternately stacked on a substrate 100. The substrate 100 may be a monocrystalline silicon substrate or a silicon-on-insulator (SOI) substrate. The sacrificial layers 103 may be formed of a material having an etch selectivity with respect to the semiconductor layers 105.

For example, the sacrificial layers 103 may include first transition metal atoms M and second chalcogen atoms X2. The first transition metal atoms M may be one of tungsten (W) and molybdenum (Mo), not being limited thereto. The second chalcogen atoms X2 may be selenium (Se), not being limited thereto. The sacrificial layers 103 may be one of $MoSe_c$ and $WSe_d$, not being limited thereto, where subscripts c and d may independently be a positive real number equal to or less than 2.

One or more of the substrate 100 and the semiconductor layers 105 may include first transition metal atoms M and first chalcogen atoms X1. The first transition metal atoms M may be one of tungsten (W) and molybdenum (Mo), not being limited thereto. The first chalcogen atoms X1 may be sulfur (S), not being limited thereto. The substrate 100 and the semiconductor layers 105 may each be one of $MoS_a$ and $WS_b$, not being limited thereto, where subscripts a and b may independently be a positive real number equal to or less than 2.

A material included in the substrate 100 and the semiconductor layers 105 may be interchangeable with that of the sacrificial layers 103.

The semiconductor layers 105, the sacrificial layers 103, and a portion of the substrate 100 may be etched to form a trench TH in the substrate 100, and simultaneously, form an active pattern AP and a stack structure 150 on the active pattern AP that protrudes from the substrate 100. The stack structure 150 may include the sacrificial layers 103 and the semiconductor layers 105 that are alternately stacked. The active pattern AP and the stack structure 150 may be formed elongated in a first direction D1. In addition, each of the active pattern AP and the stack structure 150 may be formed in plural spaced apart from each other in a second direction D2. A dielectric layer may be formed on the substrate 100, and then etched-back to form a device isolation layer ST that fills the trench TH. The device isolation layer ST may be formed to have a top surface lower than that of the active pattern AP.

Figure 10B:
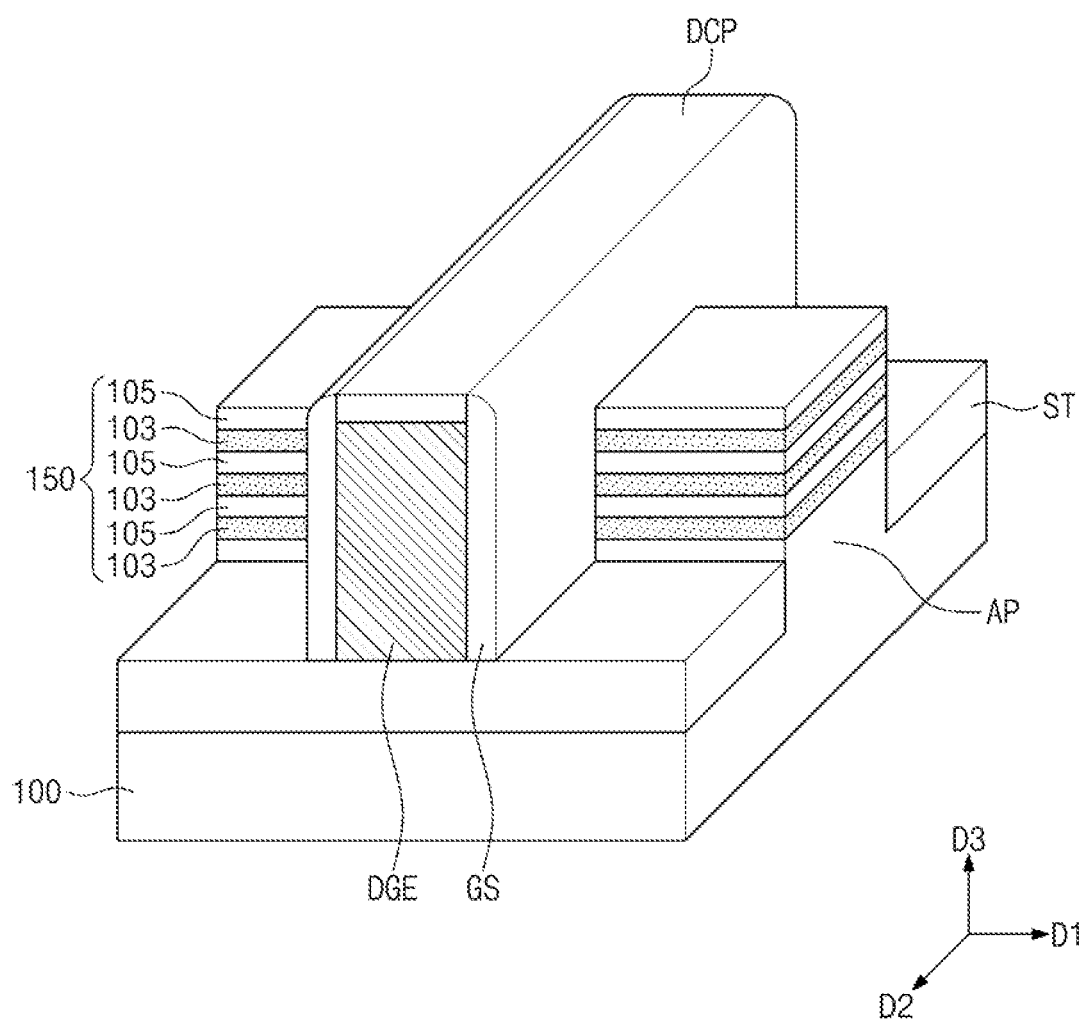

Referring to FIG. 10B, a dummy gate layer and a capping layer may be formed on an entire surface of the substrate 100, and then may be patterned to form a dummy gate electrode DGE and a dummy capping pattern DCP that run across the stack structure 150 and the active pattern AP. The dummy gate electrode DGE may be formed of a material having an etch selectivity with respect to the stack structure 150 and the active pattern AP. The dummy gate electrode DGE may include, for example, polysilicon. The dummy capping pattern DCP may include a dielectric layer, such as a silicon nitride layer. A spacer layer may be stacked on the entire surface of the substrate 100, and then may be anisotropically etched to form a gate spacer GS that covers a sidewall of the dummy gate electrode DGE and a sidewall of the dummy capping pattern DCP. The gate spacer GS may have a single-layered or multi-layered structure formed of at least one of a silicon nitride layer, a silicon oxide layer and a silicon oxynitride layer. After the gate spacer GS is formed, a top surface of the stack structure 150 may be exposed.

Figure 10C:
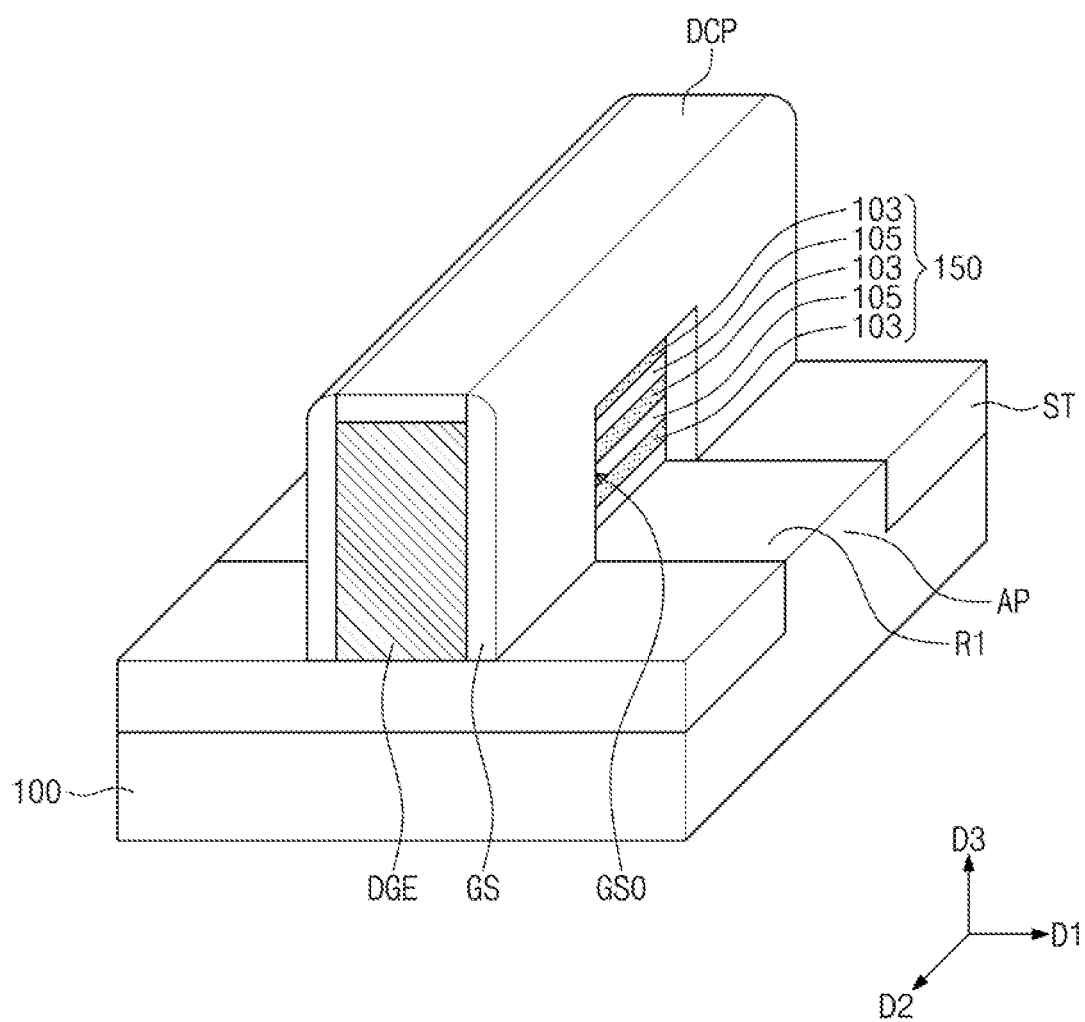

Referring to FIG. 10C, the exposed stack structure 150 on a side of the gate spacer GS may be etched to form a recess region R1 that exposes the active pattern AP. The etching of the stack structure 150 may include an anisotropic etching process and an isotropic etching process. The etching processes may partially remove an upper portion of the active pattern AP. A spacer opening GSO may be formed by the etching processes. The spacer opening GSO may expose the stack structure 150 disposed below the dummy capping pattern DCP.

Figure 10D:
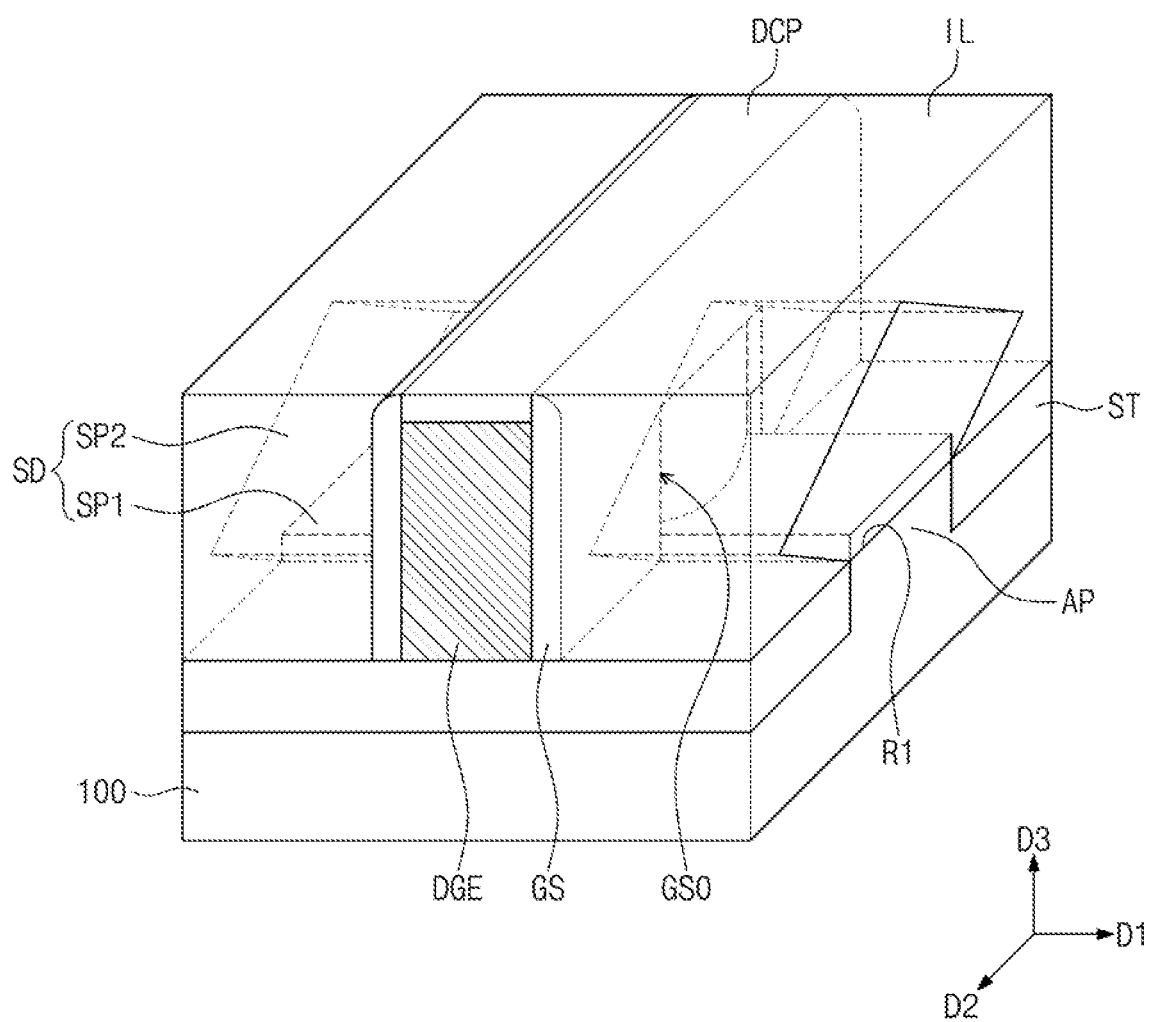

Referring to FIG. 10D, a first source/drain pattern SP1 may be formed on a sidewall and a bottom surface of the recess region R1. The first source/drain pattern SP1 may be formed to form silicon or silicon-germanium. A second source/drain pattern SP2 may be formed on the first source/drain pattern SP1. The second source/drain pattern SP2 may fill the recess region R1. An interlayer dielectric layer IL may be formed on the entire surface of the substrate 100, and may be etched and planarized to expose the dummy capping pattern DCP.

Figure 10E:
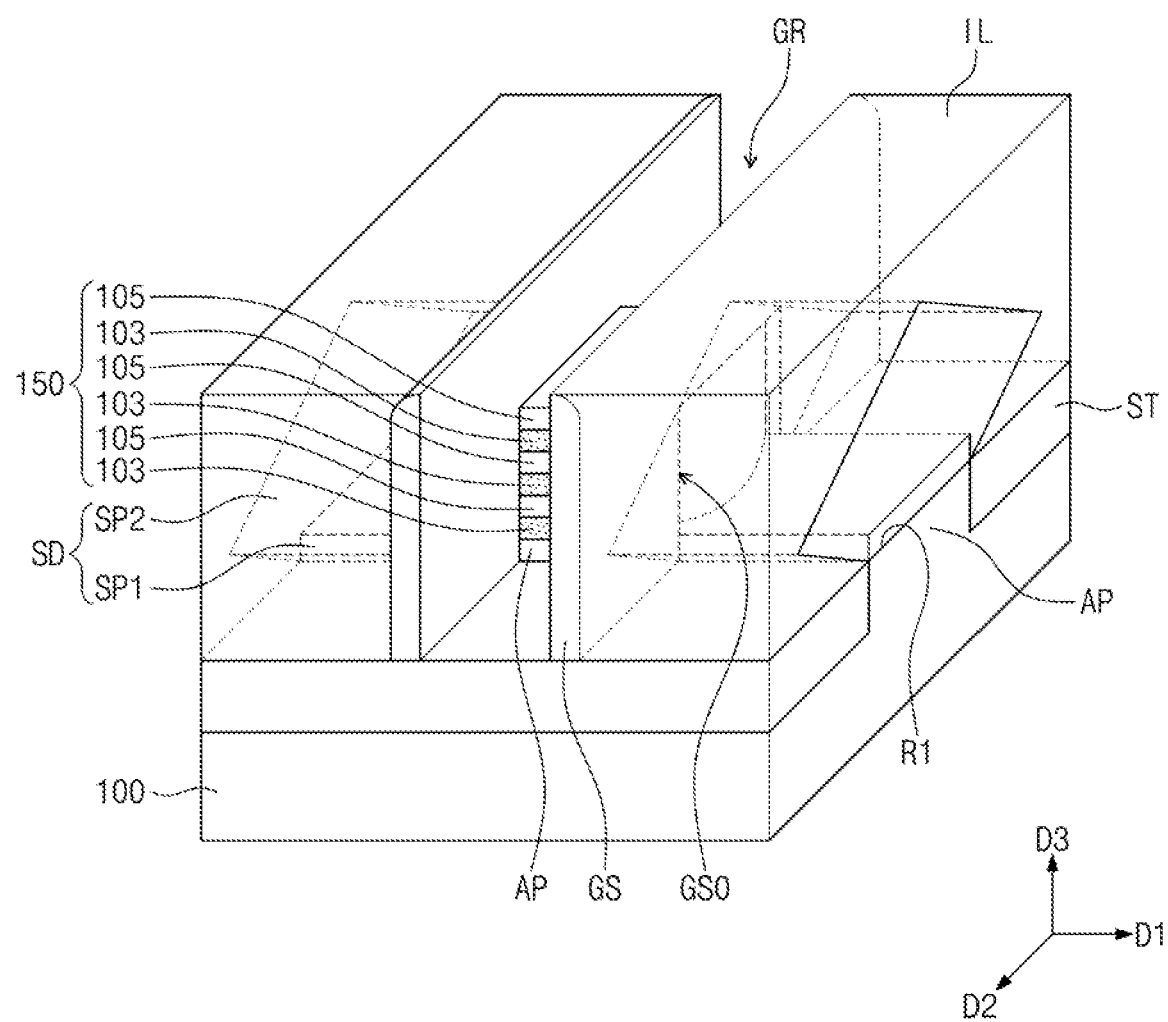

Referring to FIG. 10E, the dummy capping pattern DCP and the dummy gate electrode DGE may be removed to form a groove GR that exposes the top and lateral surfaces of the stack structure 150. In addition, the groove GR may also expose an inner lateral surface of the gate spacer GS and the top surface of the device isolation layer ST adjacent to the gate spacer GS. The exposure of the lateral surface of the stack structure 150 may reveal lateral surfaces of the sacrificial layers 103 that constitute the stack structure 150.

Figure 10F:
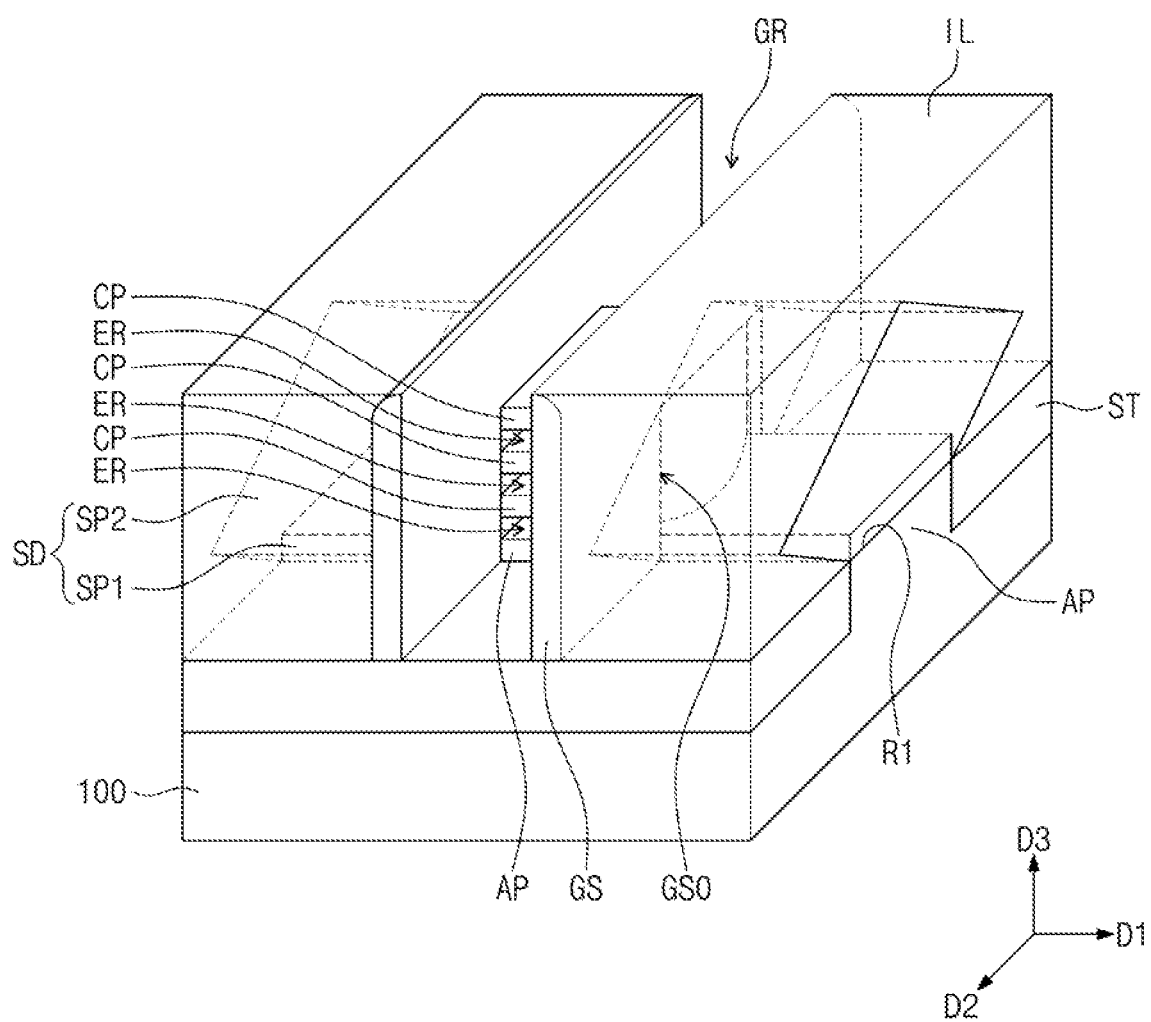

Referring to FIG. 10F, an isotropic etching process may be performed to remove the sacrificial layers 103 exposed by the groove GR. Therefore, empty spaces ER may be formed at locations where the sacrificial layers 103 are removed. The semiconductor layers 105 included in the stack structure 150 may be called semiconductor patterns CP. The empty spaces ER may expose top and bottom surfaces of the semiconductor patterns CP and the top surface of the active pattern AP. The empty spaces ER may also expose an inner sidewall of the first source/drain pattern SP1.

Subsequently, referring to FIGS. 9A to 9C, a deposition process or a thermal oxidation process may be performed to form a gate dielectric layer Gox. The gate dielectric layer Gox may be conformally formed on surfaces of the semiconductor patterns CP, a surface of the active pattern AP, and an inner sidewall of the gate spacer GS. A conductive layer may be deposited to fill the empty spaces ER and the groove GR, and then may be partially recessed to form a gate electrode GE. A gate capping pattern GP may be formed on the gate electrode GE.

In some embodiments, in a state of FIG. 10C, the substitution process discussed with reference to FIGS. 1 to 4 may be additionally performed on the semiconductor layers 105. In this step, second chalcogen atoms X2 may substitute for some of the first chalcogen atoms X1 positioned on edges and/or ends of the semiconductor layers 105. The processes discussed with reference to FIGS. 10D to 10F may be performed.

In a method of forming a PN junction structure according to the present embodiments, chemical vapor transition (CVT) may be used such that a portion of a first material layer is substituted to form a second material layer, and thus a uniform even contact interface, instead of an uneven contact interface, may be provided between the first material layer and the second material layer. Accordingly, it may be possible to fabricate a semiconductor device whose electrical reproduction is excellent.

Moreover, in a method of forming a PN junction structure according to the present embodiments, chemical vapor transition (CVT) may be applicable to the large wafer-level fabrication, and thus it may be possible to securely obtain industrial applicability and mass production.

Furthermore, in a method of forming a PN junction structure according to the present embodiments, a first mask pattern may be used to form a second material layer on one or more selected positions. As a result, it may be possible to easily fabricate semiconductor devices having various structures.

A semiconductor device according to the present embodiments may be configured such that a channel region and source/drain regions include a two-dimensional material to increase operating speed.

Although some embodiments have been discussed with reference to accompanying figures, it will be understood that various changes in form and details may be made therein without departing from the spirit and scope of the disclosure. It therefore will be understood that the embodiments described above are just illustrative but not limitative in all aspects.

What is claimed is:

1. A method of forming a PN junction structure, the method comprising:
    forming, on a substrate, a first material layer that comprises first transition metal atoms and first chalcogen atoms, the first material layer having n-type conductivity;
    loading the first material layer into a process chamber and supplying a gas of second chalcogen atoms; and
    forming a second material layer by replacing the first chalcogen atoms with the second chalcogen atoms on a selected portion of the first material layer, the second material layer having p-type conductivity such that the selected portion and a non-selected portion of the first material layer form the PN junction structure.

2. The method of claim 1, wherein the selected portion of the first material layer comprises an outside edge portion of the first material layer.

3. The method of claim 1, further comprising forming a mask pattern on a masking portion of the first material layer,
    wherein the selected portion of the first material layer is not included in the masking portion of the first material layer.

4. The method of claim 3, wherein the mask pattern comprises aluminum oxide.

5. The method of claim 1, wherein the forming the first material layer on the substrate comprises:
    forming a silicon oxide layer on the substrate comprising a monocrystalline silicon layer; and
    forming the first material layer on the silicon oxide layer.

6. The method of claim 1, before replacing the first chalcogen atoms with some of the second chalcogen atoms, further comprising:
    loading the substrate into the process chamber;
    placing a source layer comprising the second chalcogen atoms on a side of the substrate with the first material layer thereon in the process chamber, the source layer spaced apart from the substrate with the first material layer thereon; and
    supplying a carrier gas into the process chamber and evaporating the second chalcogen atoms.

7. The method of claim 6, wherein a catalytic gas is supplied simultaneously when the carrier gas is supplied into the process chamber.

8. The method of claim 7, wherein the carrier gas comprises at least one of nitrogen and argon, and
    wherein the catalytic gas comprises hydrogen.

9. The method of claim 6, wherein the source layer is heated at about 300° C. to about 1,000° C.

10. The method of claim 1, wherein the first transition metal atoms comprise tungsten or molybdenum,
    wherein the first chalcogen atoms comprise sulfur, and
    wherein the second chalcogen atoms comprise selenium.

11. A method of fabricating a semiconductor device, the method comprising:
    forming on a substrate a first material layer that comprises first transition metal atoms and first chalcogen atoms, the first material layer being a first conductivity type;
    loading the first material layer into a process chamber and supplying a gas of second chalcogen atoms;
    forming a second material layer by substituting the second chalcogen atoms for the first chalcogen atoms on a selected portion of the first material layer, the second material layer being a second conductivity type opposite to the first conductivity type; and
    forming a gate electrode on the first material layer.

12. The method of claim 11, before forming the gate electrode on the first material layer, further comprising etching the second material layer.

13. The method of claim 11, before forming the gate electrode on the first material layer, further comprising partially removing the second material layer.

14. The method of claim 11, further comprising forming a mask pattern on a masking portion of the first material layer,
    wherein the selected portion is not included in the masking portion.

15. The method of claim 14, wherein the mask pattern comprises aluminum oxide.

16. The method of claim 1, wherein the non-selected portion of the first material layer has a circular shape, and
    wherein the selected portion of the first material layer has a ring shape surrounding the non-selected portion of the first material layer.

17. The method of claim 1, wherein the non-selected portion of the first material layer comprises a first curved portion and a second curved portion smaller than the first curved portion, and wherein the non-selected portion of the first material layer has a curved band shape surrounding the second curved portion.

\* \* \* \* \*